(12) United States Patent
Kawanami

(10) Patent No.: US 10,006,945 B2
(45) Date of Patent: Jun. 26, 2018

(54) ELECTRIC CURRENT SENSOR

(71) Applicant: Murata Manufacturing Co., Ltd., Nagaokakyo-shi, Kyoto-fu (JP)

(72) Inventor: Takashi Kawanami, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days. days.

(21) Appl. No.: 15/795,359

(22) Filed: Oct. 27, 2017

(65) Prior Publication Data

US 2018/0067146 A1    Mar. 8, 2018

Related U.S. Application Data

(63) Continuation of application No. PCT/JP2016/068494, filed on Jun. 22, 2016.

(30) Foreign Application Priority Data

Jul. 1, 2015  (JP) ................. 2015-132535

(51) Int. Cl.
*G01R 15/20* (2006.01)
(52) U.S. Cl.
CPC ................... *G01R 15/205* (2013.01)
(58) Field of Classification Search
CPC ..... G01R 15/205; G01R 15/246; G01R 15/20
See application file for complete search history.

(56) References Cited

U.S. PATENT DOCUMENTS

| | | |
|---|---|---|
| 2003/0151406 A1 | 8/2003 | Wan et al. |
| 2007/0096716 A1 | 5/2007 | Shoji |
| 2013/0127456 A1* | 5/2013 | Hebiguchi ........... G01R 15/205 324/252 |
| 2013/0300404 A1 | 11/2013 | Hebiguchi |
| 2014/0247044 A1* | 9/2014 | Mitsuya ................. G01R 33/09 324/252 |
| 2014/0327437 A1* | 11/2014 | Han ....................... G01R 19/32 324/252 |
| 2015/0022196 A1 | 1/2015 | Hebiguchi et al. |

FOREIGN PATENT DOCUMENTS

| | | |
|---|---|---|
| JP | 2005-517937 A | 6/2005 |
| JP | 2007-078418 A | 3/2007 |
| JP | 2007-108069 A | 4/2007 |
| JP | 2013-088370 A | 5/2013 |
| JP | 2015-036636 A | 2/2015 |
| WO | 2012/120939 A1 | 9/2012 |
| WO | 2013/172114 A1 | 11/2013 |

OTHER PUBLICATIONS

Official Communication issued in International Patent Application No. PCT/JP2016/068494, dated Sep. 20, 2016.

\* cited by examiner

*Primary Examiner* — Jermele M Hollington
*Assistant Examiner* — Alvaro Fortich
(74) *Attorney, Agent, or Firm* — Keating & Bennett, LLP

(57) ABSTRACT

An electric current sensor includes a primary conductor through which an electric current to be measured flows, and at least one magnetic sensor. The magnetic sensor includes a first magnetic sensor area, the output sensitivity of which is decreased when a magnetic field is applied to include a magnetic field component in a first direction along a sensitivity variation axis, and a second magnetic sensor area, the output sensitivity of which is increased when the magnetic field is applied to include a magnetic field component in a second direction that is opposite to the first direction.

20 Claims, 16 Drawing Sheets

ERROR RATIO OF OUTPUT VOLTAGE
OF MAGNETIC SENSOR (%FS)

MAGNETIC FLUX DENSITY (mT)

OUTPUT VOLTAGE
(V)

MAGNETIC FLUX DENSITY (mT)

ELECTRIC CURRENT SENSOR

CROSS REFERENCE TO RELATED APPLICATIONS

This application claims the benefit of priority to Japanese Patent Application No. 2015-132535 filed on Jul. 1, 2015 and is a Continuation Application of PCT Application No. PCT/JP2016/068494 filed on Jun. 22, 2016. The entire contents of each application are hereby incorporated herein by reference.

BACKGROUND OF THE INVENTION

1. Field of the Invention

The present invention relates to an electric current sensor, and specifically relates to an electric current sensor that measures a large electric current.

2. Description of the Related Art

As prior documents that disclose the configuration of an electric current sensor or a magnetic sensor, there are Japanese Unexamined Patent Application Publication No. 2007-108069, Japanese Unexamined Patent Application Publication No. 2005-517937 and Japanese Unexamined Patent Application Publication No. 2013-88370.

An electric current sensor described in Japanese Unexamined Patent Application Publication No. 2007-108069 includes a conductor including a pair of parallel units that have substantially equal and constant cross sections and extend in parallel a first distance away from each other, a coupling unit for coupling one ends of the parallel units, and a pair of terminal units. The terminal units are connected to the other ends of the parallel units, and extend away in an opposed manner a second distance, which is larger than the first distance. The terminal unit has a larger cross section than the parallel unit.

A magnetic sensor described in Japanese Unexamined Patent Application Publication No. 2005-517937 includes at least two magnetoresistive elements that are biased in a first direction by an integral type conductor, and are sensitive to a magnetic field component in a direction orthogonal to the first direction. The sensitivity of the magnetic sensor to a magnetic field is adjustable, and is related to the level of a bias current. In an electric current sensor, two of the magnetic sensors are attached to both sides orthogonal to a conductor through which an electric current to be measured flows.

An electric current sensor described in Japanese Unexamined Patent Application Publication No. 2013-88370 includes a magnetic sensitive element that outputs an output signal by an induction field from an electric current to be measured. The magnetic sensitive element has a sensitivity axis and a sensitivity effect axis orthogonal to the sensitivity axis. The sensitivity axis is disposed to have a certain angle with respect to the direction of the induction field. The sensitivity effect axis is disposed orthogonal to a flow direction of the electric current to be measured and the direction of the induction field.

The conventional electric current sensors are used in linear ranges in which a magnetic flux density, which is detected by a magnetic sensor having a Hall element, a magnetoresistive element or the like, and an output voltage are proportional. In other words, when measuring a large electric current that generates a magnetic field exceeding the linear range of the magnetic sensor, the conventional electric current sensor has a large measurement error, thus causing a reduction in measurement accuracy.

On the other hand, when an electric current sensor provided with a magnetic sensor having a wide linear range is used to measure a large electric current, measurement accuracy of a small electric current is lowered due to the low sensitivity of the magnetic sensor.

SUMMARY OF THE INVENTION

Preferred embodiments of the present invention provide electric current sensors with a wide measurement range, while maintaining high sensitivity.

An electric current sensor according to a preferred embodiment of the present invention includes a primary conductor through which an electric current to be measured flows, and at least one magnetic sensor that detects a strength of a magnetic field generated by the electric current flowing through the primary conductor and has a detection axis and a sensitivity variation axis orthogonal or substantially orthogonal to the detection axis. The magnetic sensor includes a first magnetic sensor area the output sensitivity of which is decreased when the magnetic field is applied to include a magnetic field component in a first direction along the sensitivity variation axis, and a second magnetic sensor area the output sensitivity of which is increased when the magnetic field is applied to include a magnetic field component in a second direction that is opposite to the first direction.

In a preferred embodiment of the present invention, the magnetic sensor detects the strength of the magnetic field by combining an output from the first magnetic sensor area and an output from the second magnetic sensor area.

In another preferred embodiment of the present invention, the magnetic sensor includes at least one magnetoresistive element. A portion of the magnetoresistive element is situated in the first magnetic sensor area. Another portion of the magnetoresistive element is situated in the second magnetic sensor area.

In another preferred embodiment of the present invention, the magnetic sensor includes a plurality of magnetoresistive elements. A portion of the plurality of magnetoresistive elements are situated in the first magnetic sensor area. Another portion of the plurality of magnetoresistive elements are situated in the second magnetic sensor area.

In another preferred embodiment of the present invention, in the magnetic sensor, the first magnetic sensor area and the second magnetic sensor area are provided in a direction along the detection axis. The magnetic sensor is opposed to the primary conductor in the thickness direction of the primary conductor such that a direction of the magnetic sensor along the sensitivity variation axis intersects the width direction of the primary conductor.

In another preferred embodiment of the present invention, in the magnetic sensor, the first magnetic sensor area, and the second magnetic sensor area extend in the direction along the detection axis. The magnetic sensor is opposed to the primary conductor in the width direction of the primary conductor such that a direction of the magnetic sensor along the sensitivity variation axis intersects the thickness direction of the primary conductor.

In a preferred embodiment of the present invention, the electric current sensor includes a first magnetic sensor and a second magnetic sensor as the magnetic sensor. The electric current is divided into two currents to flow through two flow paths of the primary conductor in the length direction of the primary conductor. In the primary conductor, a first flow path portion defining one of the two flow paths and a second flow path portion defining the other of the two flow paths extend in an opposed manner a certain distance away from each other in the thickness direction of the primary conductor. In each of the first magnetic sensor and the second magnetic sensor, the first magnetic sensor area and the second magnetic sensor area extending the direction along the detection axis. The first magnetic sensor is opposed to the first flow path portion in the thickness direction of the primary conductor between the first flow path portion and the second flow path portion such that a direction of the first magnetic sensor along the sensitivity variation axis intersects the width direction of the primary conductor. The second magnetic sensor is opposed to the second flow path portion in the thickness direction of the primary conductor between the first flow path portion and the second flow path portion such that a direction of the second magnetic sensor along the sensitivity variation axis intersects the width direction of the primary conductor.

In another preferred embodiment of the present invention, the electric current sensor includes a first magnetic sensor and a second magnetic sensor as the magnetic sensor. The electric current is divided into two currents to flow through two flow paths of the primary conductor in the length direction of the primary conductor. In the primary conductor, a first flow path portion defining one of the two flow paths and a second flow path portion defining the other of the two flow paths are staggered relative to each other a certain distance away in the width direction of the primary conductor, while being staggered relative to each other a certain distance away in the thickness direction of the primary conductor. In each of the first magnetic sensor and the second magnetic sensor, the first magnetic sensor area and the second magnetic sensor area are provided in a direction along the sensitivity variation axis. The first magnetic sensor is opposed, in the thickness direction of the primary conductor, to a portion of the first flow path portion that is on the side of the second flow path portion in the width direction of the primary conductor, between the first flow path portion and the second flow path portion in the thickness direction of the primary conductor, such that a direction of the first magnetic sensor along the sensitivity variation axis intersects the width direction of the primary conductor. The second magnetic sensor is opposed, in the thickness direction of the primary conductor, to a portion of the second flow path portion that is on the side of the first flow path portion in the width direction of the primary conductor, between the first flow path portion and the second flow path portion in the thickness direction of the primary conductor, such that a direction of the second magnetic sensor along the sensitivity variation axis intersects the width direction of the primary conductor.

In another preferred embodiment of the present invention, the electric current sensor further includes a calculator that calculates the value of the electric current by arithmetic processing of the detection value of the first magnetic sensor and the detection value of the second magnetic sensor. As to the strength of the magnetic field generated by the electric current flowing through the primary conductor, the detection value of the first magnetic sensor is in opposite phase with the detection value of the second magnetic sensor. The calculator is a subtractor or a differential amplifier.

In another preferred embodiment of the present invention, the electric current sensor further includes a calculator that calculates the value of the electric current by arithmetic processing of the detection value of the first magnetic sensor and the detection value of the second magnetic sensor. As to the strength of the magnetic field generated by the electric current flowing through the primary conductor, the detection value of the first magnetic sensor is in phase with the detection value of the second magnetic sensor. The calculator is an adder or a summing amplifier.

According to preferred embodiments of the present invention, it is possible to increase a measurement range of an electric current sensor, while maintaining high sensitivity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
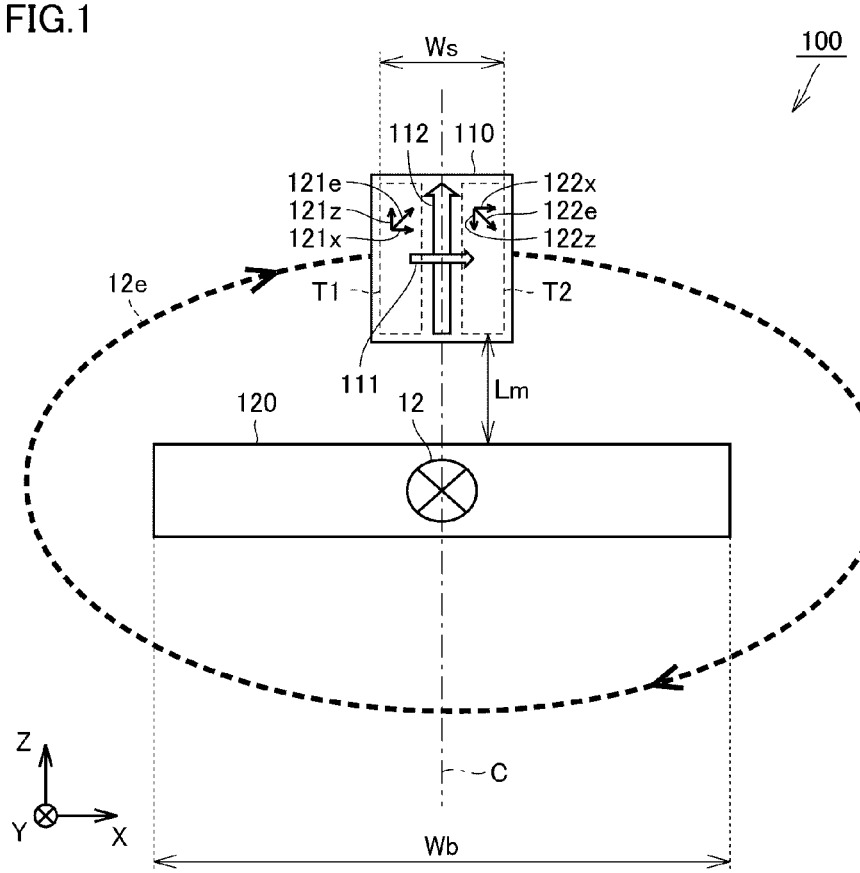
FIG. 1 is a cross-sectional view showing the structure of an electric current sensor according to a first preferred embodiment of the present invention.
Figure 2:
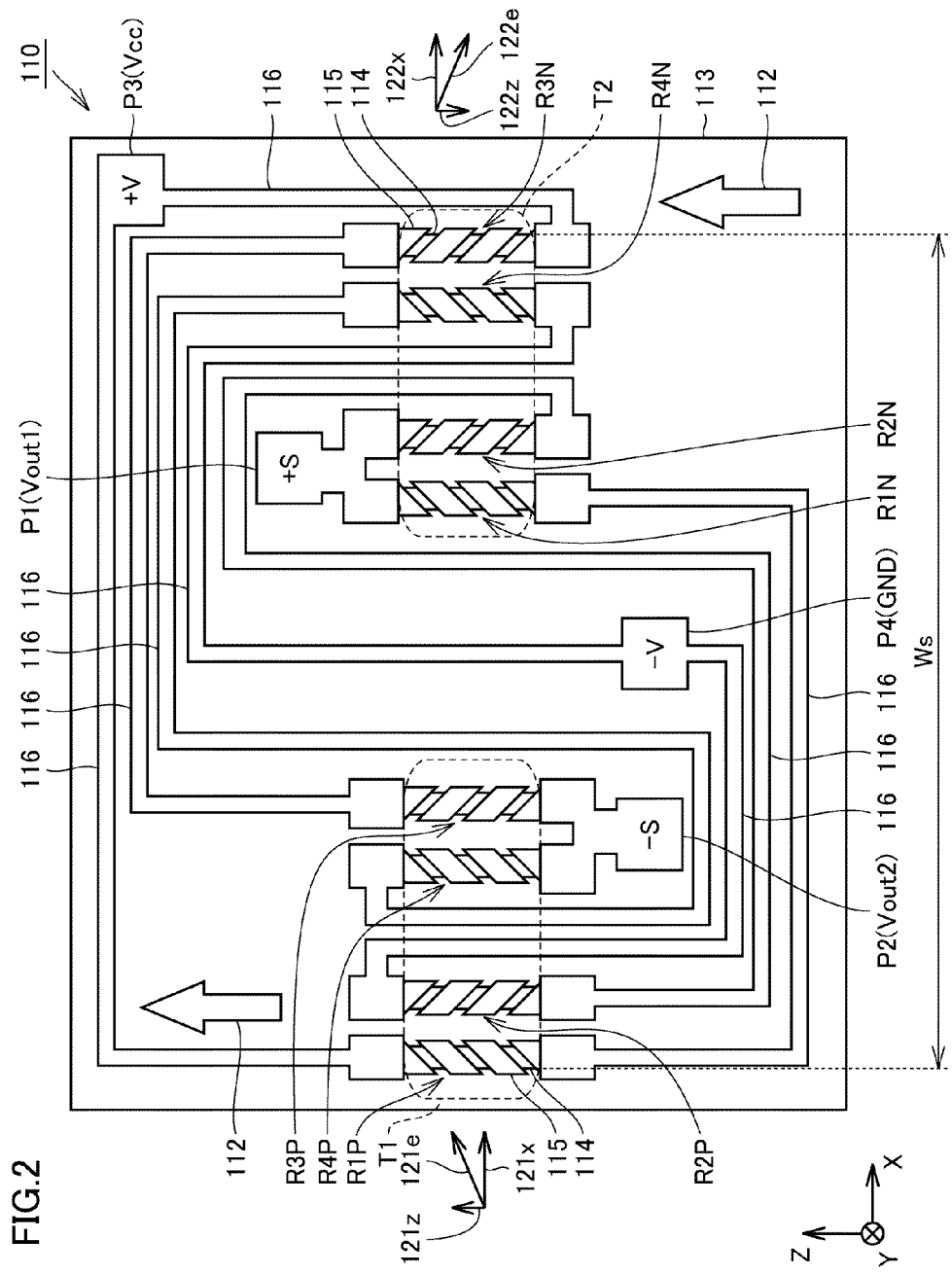
FIG. 2 is a plan view showing the structure of a magnetic sensor included in the electric current sensor according to the first preferred embodiment of the present invention.
Figure 3:
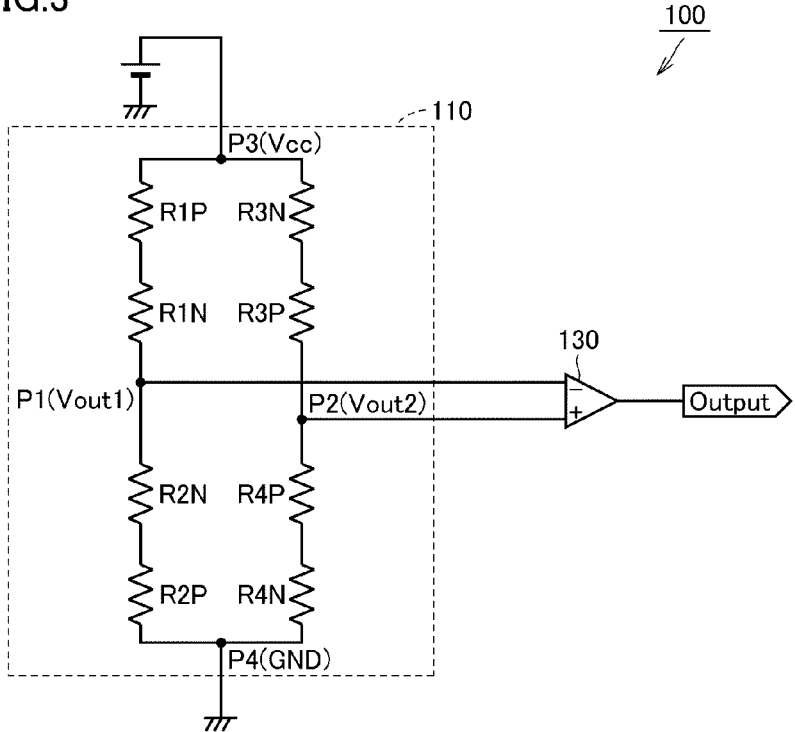
FIG. 3 is a circuit diagram showing the circuit configuration of the electric current sensor according to the first preferred embodiment of the present invention.

Electric current sensors according to preferred embodiments of the present invention will be described below with reference to the drawings. In the following description of the preferred embodiments of the present invention, the same reference numerals indicate the same or similar components in the drawings, and a description thereof is not repeated.
First Preferred Embodiment FIG. 1 is a cross-sectional view showing the structure of an electric current sensor according to a first preferred embodiment of the present invention. FIG. 2 is a plan view showing the structure of a magnetic sensor included in the electric current sensor according to the first preferred embodiment of the present invention. FIG. 3 is a circuit diagram showing the circuit configuration of the electric current sensor according to the first preferred embodiment of the present invention. In FIGS. 1 and 2, an X-axis direction refers to the direction of the width of a primary conductor 120 described later. A Y-axis direction refers to the direction of the length of the primary conductor 120. A Z-axis direction refers to the direction of the thickness of the primary conductor 120. FIG. 1 shows a virtual center line C that passes through the center of the width of the primary conductor 120 and extends in the thickness direction (Z-axis direction) of the primary conductor 120.

As shown in FIG. 1, an electric current sensor 100 according to the first preferred embodiment of the present invention includes the primary conductor 120 through which an electric current 12 to be measured flows, and one magnetic sensor 110 that detects the strength of a magnetic field (hereafter referred to as a measured magnetic field) 12e generated by the electric current 12 to be measured flowing through the primary conductor 120 and has a detection axis 111 and a sensitivity variation axis 112 orthogonal to the detection axis 111. The electric current 12 to be measured flows through the primary conductor 120 in the length direction (Y-axis direction) of the primary conductor 120.

The magnetic sensor 110 includes a first magnetic sensor area T1 the output sensitivity of which is decreased when the measured magnetic field 12e is applied to include a magnetic field component in a first direction along the sensitivity variation axis 112, and a second magnetic sensor area T2 the output sensitivity of which is increased when the measured magnetic field 12e is applied to include a magnetic field component in a second direction that is opposite to the first direction. The magnetic sensor 110 detects the strength of the measured magnetic field 12e by combining an output from the first magnetic sensor area T1 and an output from the second magnetic sensor area T2. Note that, the first direction is the direction of an arrow of the sensitivity variation axis 112.

In the magnetic sensor 110, the first magnetic sensor area T1 and the second magnetic sensor area T2 are provided in a direction along the detection axis 111. The magnetic sensor 110 is opposed to the primary conductor 120 in the thickness direction (Z-axis direction) of the primary conductor 120, in such a manner that the direction of the magnetic sensor 110 along the sensitivity variation axis 112 intersects the width direction (X-axis direction) of the primary conductor 120.

In this preferred embodiment, the direction of the magnetic sensor 110 along the sensitivity variation axis 112 intersects the width direction (X-axis direction) of the primary conductor 120 at right angles. The magnetic sensor 110 is disposed on the virtual center line C, and opposed to a front surface of the primary conductor 120. The virtual center line C is situated between the first magnetic sensor area T1 and the second magnetic sensor area T2.

Each component will be described below in detail.

In this preferred embodiment, the primary conductor 120 preferably has a strip shape and Wb represents the width of the primary conductor 120. The primary conductor 120 is preferably made of copper. However, the primary conductor 120 is not limited to this and may be made of a metal such as, for example, silver, aluminum, or an alloy containing the metals.

The primary conductor 120 may preferably be subjected to a surface treatment. For example, at least one plating layer that is made of a metal such as, for example, nickel, tin, silver, copper, or an alloy containing the metals may be provided on the surface of the primary conductor 120.

In this preferred embodiment, the primary conductor 120 is preferably made by pressing a thin plate. However, the method of making the primary conductor 120 is not limited to this, the primary conductor 120 may be formed by another method such as cutting or casting.

Next, the structure of the magnetic sensor 110 provided in the electric current sensor 100 according to this preferred embodiment will be described.

As shown in FIGS. 2 and 3, the magnetic sensor 110 provided in the electric current sensor 100 according to this preferred embodiment preferably includes a Wheatstone bridge circuit (full-bridge circuit) in which eight magnetoresistive elements R1P, R1N, R2P, R2N, R3P, R3N, R4P and R4N provided on a substrate 113 are electrically connected.

The magnetoresistive elements R1P, R1N, R2P, R2N, R3P, R3N, R4P and R4N are provided along a width direction (X-axis direction) of the substrate 113. The magnetoresistive elements R1P, R2P, R3P and R4P are each situated in the first magnetic sensor area T1. The magnetoresistive elements R1N, R2N, R3N and R4N are each situated in the second magnetic sensor area T2.

Ws represents the length of an area having the magnetoresistive elements R1P, R1N, R2P, R2N, R3P, R3N, R4P and R4N of the substrate 113 in the width direction (X-axis direction). Ws≥0.05 Wb preferably holds true. As shown in FIG. 1, Lm represents the minimum distance between each of the magnetoresistive elements R1P, R1N, R2P, R2N, R3P, R3N, R4P and R4N and the front surface of the primary conductor 120 in the thickness direction (Z-axis direction) of the primary conductor 120. Lm≤Wb preferably holds true.

Each of the magnetoresistive elements R1P, R1N, R2P, R2N, R3P, R3N, R4P and R4N is preferably an AMR (anisotropic magneto resistance) element. However, each of the magnetoresistive elements R1P, R1N, R2P, R2N, R3P, R3N, R4P and R4N may be a GMR (giant magneto resistance), a TMR (tunnel magneto resistance), a BMR (ballistic magneto resistance), a CMR (colossal magneto resistance) or the like.

On the substrate 113, an electrode pad P1 that takes out an output voltage Vout1, an electrode pad P2 that takes out an output voltage Vout2, an electrode pad P3 that applies a power voltage Vcc, and a grounded electrode pad P4 are preferably provided. Connection wiring 116 is preferably provided on the substrate 113 formed by patterning together with the electrode pads.

One end of the magnetoresistive element R1P is electrically connected to the electrode pad P3 through the connection wiring 116. One end of the magnetoresistive element R1N is electrically connected to the electrode pad P1 through the connection wiring 116. The other end of the magnetoresistive element R1P is electrically connected to the other end of the magnetoresistive element R1N through the connection wiring 116. One end of the magnetoresistive element R2N is electrically connected to the electrode pad P1 through the connection wiring 116. One end of the magnetoresistive element R2P is electrically connected to the electrode pad P4 through the connection wiring 116. The other end of the magnetoresistive element R2N is electrically connected to the other end of the magnetoresistive element R2P through the connection wiring 116.

Electrically connecting the electrode pad P3, the magnetoresistive element R1P, the magnetoresistive element R1N, the electrode pad P1, the magnetoresistive element R2N, the magnetoresistive element R2P and the electrode pad P4 in series, as described above, defines a first half bridge circuit.

One end of the magnetoresistive element R3N is electrically connected to one end of the magnetoresistive element R3P through the connection wiring 116. The other end of the magnetoresistive element R3N is electrically connected to the electrode pad P3 through the connection wiring 116. The other end of the magnetoresistive element R3P is electrically connected to the electrode pad P2 through the connection wiring 116. One end of the magnetoresistive element R4P is electrically connected to one end of the magnetoresistive element R4N through the connection wiring 116. The other end of the magnetoresistive element R4P is electrically connected to the electrode pad P2 through the connection wiring 116. The other end of the magnetoresistive element R4N is electrically connected to the electrode pad P4 through the connection wiring 116.

Electrically connecting the electrode pad P3, the magnetoresistive element R3N, the magnetoresistive element R3P, the electrode pad P2, the magnetoresistive element R4P, the magnetoresistive element R4N and the electrode pad P4 in series, as described above, provides a second half bridge circuit.

Electrically connecting the first half bridge circuit and the second half bridge circuit in parallel with each other provides the Wheatstone bridge circuit (full-bridge circuit). The magnetic sensor 110 preferably includes the full-bridge circuit in this preferred embodiment, but may include only the first half bridge circuit or only one magnetoresistive element.

Each of the magnetoresistive elements R1P, R1N, R2P, R2N, R3P, R3N, R4P and R4N includes a magnetoresistive film 114 made of a ferromagnetic thin film provided on the substrate 113, and a barber-pole electrode 115 provided on the magnetoresistive film 114. The magnetoresistive film 114 having a rectangular or substantially rectangular outer shape extends along a length direction (Z-axis direction) of the substrate 113. A magnetization direction of the magnetoresistive film 114 is determined by the shape anisotropy of the magnetoresistive film 114. The sensitivity variation axis 112 extends along the magnetization direction of the magnetoresistive film 114, and extends along a longitudinal direction of the magnetoresistive film 114 in this preferred embodiment.

Note that, as a method of determining the magnetization direction of the magnetoresistive film 114, a method of providing a permanent magnet or a thin film magnet in the vicinity of the magnetoresistive film 114, a method of providing an exchange coupling or interphase coupling in the magnetoresistive film 114, a method using an induction field of a coil provided in the vicinity of the magnetoresistive film 114, a method using residual magnetic flux of a magnetic material provided in the vicinity of the magnetoresistive film 114, or the like may be adopted instead of the method using the shape anisotropy of the magnetoresistive film 114. When adopting the method using an induction field of a coil provided in the vicinity of the magnetoresistive film 114, the strength of a bias magnetic field to be applied to the magnetoresistive film 114 is adjustable by varying the magnitude of an electric current flowing through the coil. The strength of magnetization of the magnetoresistive film 114 (the strength of the bias magnetic field) is preferably twice or more as high as the strength of a magnetic field component of the measured magnetic field along the sensitivity variation axis 112.

In each of the magnetoresistive elements R1P, R1N, R4P and R4N, the barber-pole electrode 115 is defined by a plurality of first electrode portions that extend to obliquely intersect the longitudinal direction of the magnetoresistive film 114. The plurality of first electrode portions are arranged in the longitudinal direction of the magnetoresistive film 114 at established intervals from each other.

In each of the magnetoresistive elements R2P, R2N, R3P and R3N, the barber-pole electrode 115 is defined by a plurality of second electrode portions that extend to obliquely intersect the longitudinal direction of the magnetoresistive film 114. The plurality of second electrode portions are arranged in the longitudinal direction of the magnetoresistive film 114 at established intervals from each other.

The barber-pole electrode 115 of the magnetoresistive element R1P and the barber-pole electrode 115 of the magnetoresistive element R3N are axisymmetric with respect to the virtual center line extending in the Z-axis direction between the first half bridge circuit and the second half bridge circuit. The barber-pole electrode 115 of the magnetoresistive element R2P and the barber-pole electrode 115 of the magnetoresistive element R4N are axisymmetric with respect to the virtual center line. The barber-pole electrode 115 of the magnetoresistive element R3P and the barber-pole electrode 115 of the magnetoresistive element R1N are axisymmetric with respect to the virtual center line. The barber-pole electrode 115 of the magnetoresistive element R4P and the barber-pole electrode 115 of the magnetoresistive element R2N are axisymmetric with respect to the virtual center line.

Each of the magnetoresistive elements R1P, R1N, R2P, R2N, R3P, R3N, R4P and R4N including the barber-pole electrode 115 has odd function input and output characteristics. More specifically, each of the magnetoresistive elements R1P, R1N, R2P, R2N, R3P, R3N, R4P and R4N having the barber-pole electrode 115 is biased such that an electric current flows in a direction that defines a certain angle (e.g., about 45°) with the magnetization direction of the magnetoresistive film 114.

With this configuration, the resistance characteristics of each of the magnetoresistive elements R1P, R1N, R4P and R4N are opposite to those of each of the magnetoresistive elements R2P, R2N, R3P and R3N. For example, when a magnetic field component is applied to the direction of an arrow of the detection axis 111, each of the magnetoresistive elements R1P, R1N, R4P and R4N has an increased resistance value, while each of the magnetoresistive elements R2P, R2N, R3P and R3N has a decreased resistance value. By applying the power voltage Vcc between the electrode pad P3 and the electrode pad P4, an output voltage Vout1 is taken from the electrode pad P1, and an output voltage Vout2 is taken from the electrode pad P2 in accordance with the strength of the measured magnetic field. A differential amplifier 130 differentially amplifies the output voltage Vout1 and the output voltage Vout2. The power voltage Vcc may be a constant direct-current voltage, an alternating-current voltage or a pulse voltage. The operation of the electric current sensor 100 will be described below.

As shown in FIG. 1, when the electric current 12 to be measured flows through the primary conductor 120, the measured magnetic field 12e rotating counterclockwise in the drawing is generated by the so-called corkscrew rule. As a result, as shown in FIGS. 1 and 2, an input magnetic field 121e is applied to the first magnetic sensor area T1, while an input magnetic field 122e is applied to the second magnetic sensor area T2.

The input magnetic field 121e includes a magnetic field component 121x in the direction of the arrow of the detection axis 111 and a magnetic field component 121z in the first direction along the sensitivity variation axis 112. The input magnetic field 122e includes a magnetic field component 122x in the direction of the arrow of the detection axis 111 and a magnetic field component 122z in the second direction along the sensitivity variation axis 112.

Since the magnetic field component 121z travels in the same direction as the magnetization direction of the magnetoresistive film 114 (the direction of the arrow of the sensitivity variation axis 112), each of the magnetoresistive elements R1P, R2P, R3P and R4P has decreased output sensitivity. Since the magnetic field component 122z travels in the opposite direction to the magnetization direction of the magnetoresistive film 114 (the direction of the arrow of the sensitivity variation axis 112), each of the magnetoresistive elements R1N, R2N, R3N and R4N has increased output sensitivity.

Since both of the magnetic field component 121x and the magnetic field component 122x travel in the direction of the arrow of the detection axis 111, each of the magnetoresistive elements R1P, R1N, R4P and R4N has an increased resistance value, while each of the magnetoresistive elements R2P, R2N, R3P and R3N has a decreased resistance value.

Figure 4:
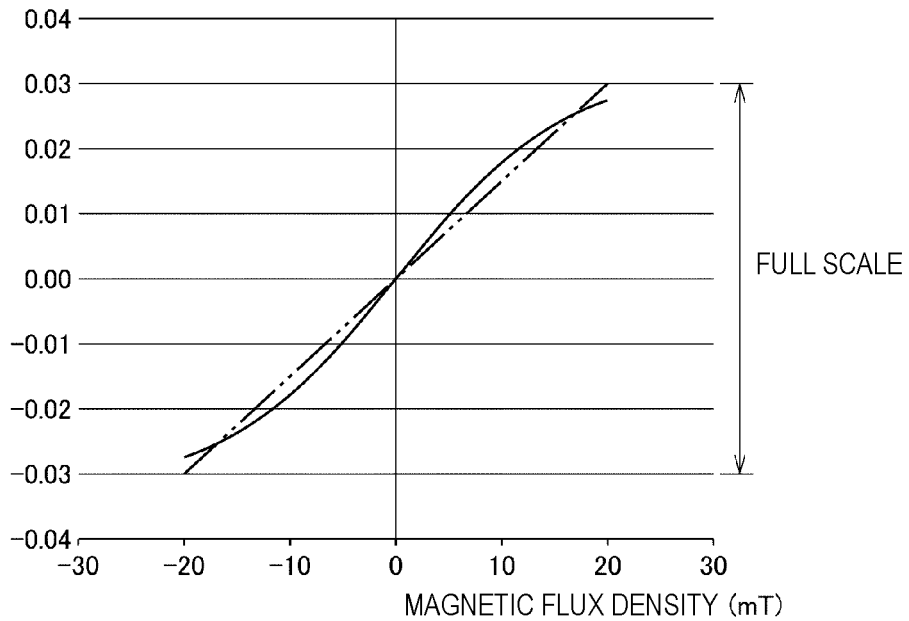
FIG. 4 is a graph of the output characteristics when an input magnetic field is applied in the direction of a detection axis to a conventional magnetic sensor.

A simulation analysis result on the output characteristics of a conventional magnetic sensor will be described. FIG. 4 is a graph of the output characteristics when an input magnetic field is applied in the direction of a detection axis to the conventional magnetic sensor. In FIG. 4, a vertical axis represents an output voltage (V), and a horizontal axis represents the magnetic flux density (mT) of the input magnetic field. In FIG. 4, a chain double-dashed line represents a virtual output voltage to which an output voltage of the conventional magnetic sensor corresponding to the magnetic flux density of the input magnetic field is linearly approximated. To be more specific, the virtual output voltage of the conventional magnetic sensor was calculated by linear function approximation of the relationship between the magnetic flux density of the input magnetic field and the output voltage, using a method of least squares.

As conditions of the simulation analysis of the conventional magnetic sensor, in a Wheatstone bridge circuit (full-bridge circuit) including four electrically connected magnetoresistive elements, a magnetic field was applied in the same direction to each of the four magnetoresistive elements. A bridge resistance Rb was 600Ω. A power voltage Vcc was 3.00 V. A bias magnetic field Hb was 300 Oe. The MR ratio (ΔR/R) of an AMR element was 2.0%. The extending direction $\theta_{BBP}$ of a first electrode portion of a barber-pole electrode was 45°. The extending direction $\theta_{BBP}$ of a second electrode portion of a barber-pole electrode was −45°. The application direction θex of a measured magnetic field was 90°. Each of the application direction and the extending directions is represented as a positive value when the direction is in the range of less than 180° clockwise relative to the direction of the arrow of the sensitivity variation axis 112, while each of the application direction and the extending directions is represented as a negative value when the direction is in the range of 180° or less counterclockwise.

As shown in FIG. 4, in the output characteristics when the input magnetic field is applied to the conventional magnetic sensor in the direction of the detection axis, the output characteristics are saturated and an increased rate of the absolute value of the output voltage is decreased with an increase in the absolute value of the magnetic flux density of the input magnetic field, thus increasing the difference between the output voltage and the virtual output voltage.

An error ratio of the output voltage of the magnetic sensor is now defined. The error ratio of the output voltage of the magnetic sensor is defined as the ratio of difference between the output voltage and the virtual output voltage, in a full scale that is a distance between a maximum value and a minimum value of the virtual output voltage in the range of the measured magnetic field.

For example, when the range of the measured magnetic field is ±20 mT, the virtual output voltage is 0.03 V when the magnetic flux density is 20 mT, and the virtual output voltage is −0.03 V when the magnetic flux density is −20 mT, the full scale is 0.06 V. In a case where the magnetic flux density is 15 mT, when the output voltage is 0.0235 V and the virtual output voltage is 0.022 V, the output error ratio of the magnetic sensor is (0.0235−0.022)/0.06×100=2.5%.

Figure 5:
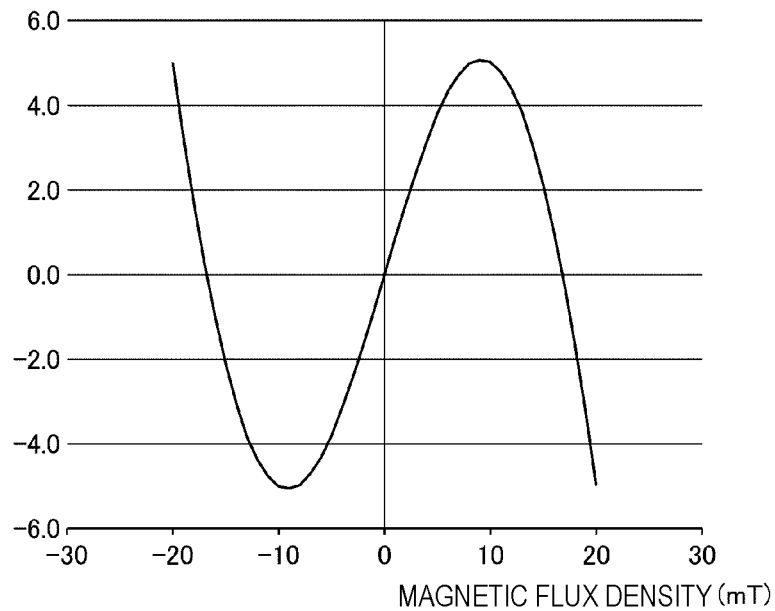
FIG. 5 is a graph of the relationship between magnetic flux density of the input magnetic field and an error ratio of an output voltage in the conventional magnetic sensor.

FIG. 5 is a graph of the relationship between magnetic flux density of the input magnetic field and the error ratio of the output voltage in the conventional magnetic sensor. In FIG. 5, a vertical axis represents the error ratio (% FS) of the output voltage, and a horizontal axis represents the magnetic flux density (mT) of the input magnetic field.

As shown in FIG. 5, in the conventional magnetic sensor, at a point where the absolute value of the magnetic flux density of the input magnetic field exceeds approximately 10 mT, the absolute value of the error ratio of the output voltage becomes a saturated state and reaches approximately 5% FS.

Figure 6:
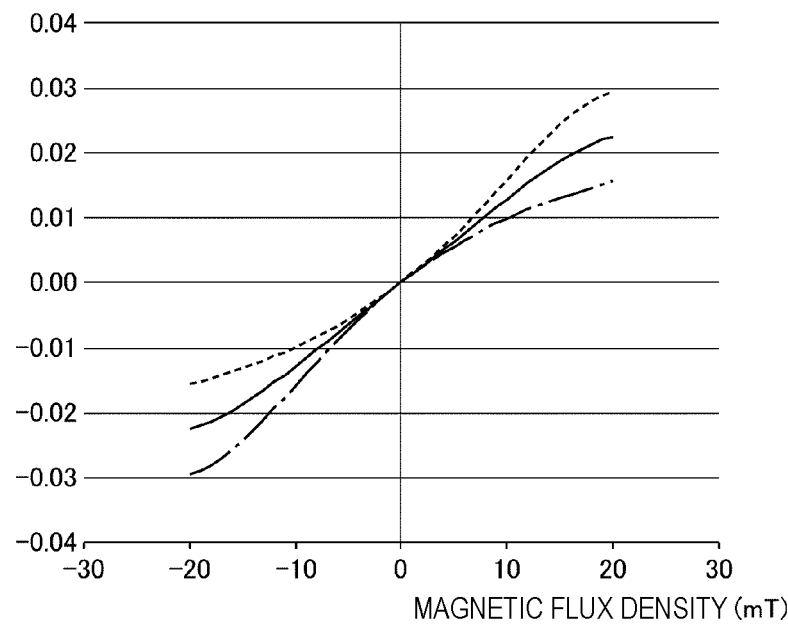
FIG. 6 is a graph of the output characteristics of the magnetic sensor provided in the electric current sensor according to the first preferred embodiment of the present invention, when a measured magnetic field is applied.

Next, a simulation analysis result on the output characteristics of the magnetic sensor provided in the electric current sensor according to the first preferred embodiment of the present invention will be described. FIG. 6 is a graph of the output characteristics of the magnetic sensor provided in the electric current sensor according to the first preferred embodiment of the present invention, when the measured magnetic field is applied. In FIG. 6, a vertical axis represents an output voltage (V), and a horizontal axis represents the magnetic flux density (mT) of the input magnetic field. In FIG. 6, an alternate long and short dashed line represents an output from the first magnetic sensor area T1. A dotted line represents an output from the second magnetic sensor area T2. A solid line represents an output from the magnetic sensor 110. In FIG. 6, the density of magnetic flux traveling in the direction of the arrow of the detection axis 111 of the magnetic sensor 110 of FIG. 1 is represented as a positive value.

As conditions of the simulation analysis of the magnetic sensor provided in the electric current sensor according to the first preferred embodiment of the present invention, a bridge resistance Rb was 600Ω. A power voltage Vcc was 3.00 V. A bias magnetic field Hb was 300 Oe. The MR ratio (ΔR/R) of an AMR element was 2.0%. The extending direction $\theta_{BBP}$ of a first electrode portion of a barber-pole electrode was 45°. The extending direction $\theta_{BBP}$ of a second electrode portion of a barber-pole electrode was −45°. The application direction θex of a measured magnetic field was 30° in the first magnetic sensor area T1. The application direction θex of the measured magnetic field was 150° in the second magnetic sensor area T2. Each of the application directions and the extending directions is represented as a positive value when the direction is in the range of less than 180° clockwise relative to the direction of the arrow of the sensitivity variation axis 112, while each of the application direction and the extending directions is represented as a negative value when the direction is in the range of 180° or less counterclockwise.

As shown in FIGS. 1 and 6, when the measured magnetic field 12e is applied to the magnetic sensor 110 provided in the electric current sensor 100 according to this preferred embodiment, the first magnetic sensor area T1 has decreased output sensitivity caused by the application of the input magnetic field 121e, while the second magnetic sensor area T2 has increased output sensitivity caused by the application of the input magnetic field 122e. Since an output from the magnetic sensor 110 is the average value of an output from the first magnetic sensor area T1 and an output from the second magnetic sensor area T2, fluctuation in output sensitivity is reduced.

The output from the first magnetic sensor area T1 does not have a clear saturated state because of a decrease in the output sensitivity. The output sensitivity of the second magnetic sensor area T2 is increased at a higher rate than a rate of the decrease in the output sensitivity of the first magnetic sensor area T1, at a point where the magnetic flux density of the input magnetic field exceeds approximately 5 mT.

Figure 7:
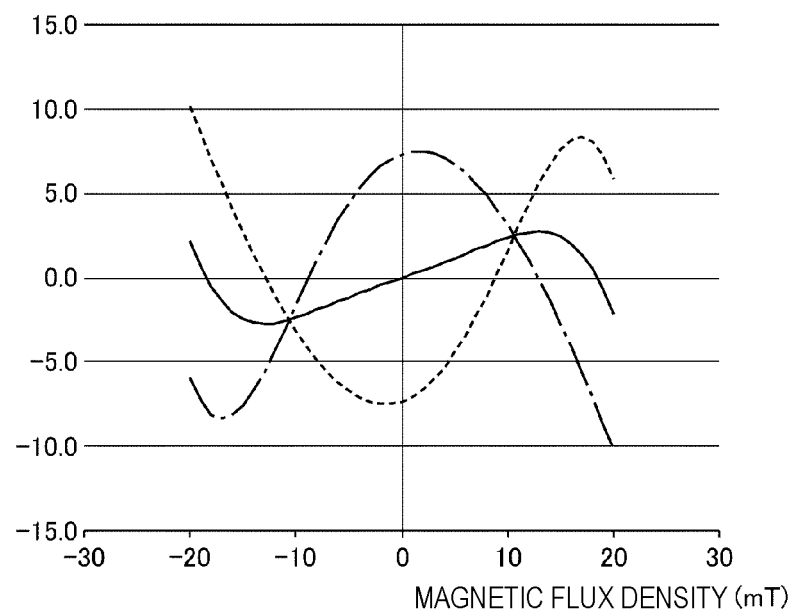
FIG. 7 is a graph showing the relationship between magnetic flux density of an input magnetic field and an error ratio of an output voltage in the magnetic sensor provided in the electric current sensor according to the first preferred embodiment of the present invention.

FIG. 7 is a graph showing the relationship between the magnetic flux density of the input magnetic field and the error ratio of the output voltage in the magnetic sensor provided in the electric current sensor according to the first preferred embodiment of the present invention. In FIG. 7, a vertical axis represents the error ratio (% FS) of the output voltage, and a horizontal axis represents the magnetic flux density (mT) of the input magnetic field. In FIG. 7, an alternate long and short dashed line represents an output from the first magnetic sensor area T1. A dotted line represents an output from the second magnetic sensor area T2. A solid line represents an output from the magnetic sensor 110. In FIG. 7, the density of magnetic flux traveling in the direction of the arrow of the detection axis 111 of the magnetic sensor 110 of FIG. 1 is represented as a positive value.

As shown in FIG. 7, in the magnetic sensor 110 provided in the electric current sensor 100 according to this preferred embodiment, the error ratio of the output voltage does not become a saturated state, until the magnetic flux density of the input magnetic field exceeds approximately 14 mT, thus reducing the error ratio of the output voltage to 2.5% FS or less. In other words, the magnetic sensor 110 of the electric current sensor 100 according to this preferred embodiment maintains high linearity between the input magnetic field and the output voltage in a wide range. Therefore, the electric current sensor 100 according to this preferred embodiment has a wide measurement range while maintaining high sensitivity.

In the magnetic sensor 110 provided in the electric current sensor 100 according to this preferred embodiment, since the strength of magnetization of the magnetoresistive film 114 (the strength of the bias magnetic field) is twice or more as high as the strength of the magnetic field component of the measured magnetic field along the sensitivity variation axis 112, it is possible to have the effect of maintaining high linearity between the input magnetic field and the output voltage in a wide range.

In the electric current sensor 100 according to this preferred embodiment, since Ws≥0.05 Wb and Lm≤Wb hold true, it is possible to stably obtain the effect of having a wide measurement range, while maintaining high sensitivity.

Second Preferred Embodiment

An electric current sensor according to a second preferred embodiment of the present invention will be described below. Note that, the main difference between an electric current sensor 200 according to this preferred embodiment and the electric current sensor 100 according to the first preferred embodiment is that a primary conductor is divided into two flow paths and two magnetic sensors are provided, so the same reference numerals indicate the same components as those of the electric current sensor 100 of the first preferred embodiment, and a description thereof is not repeated.

Figure 8:
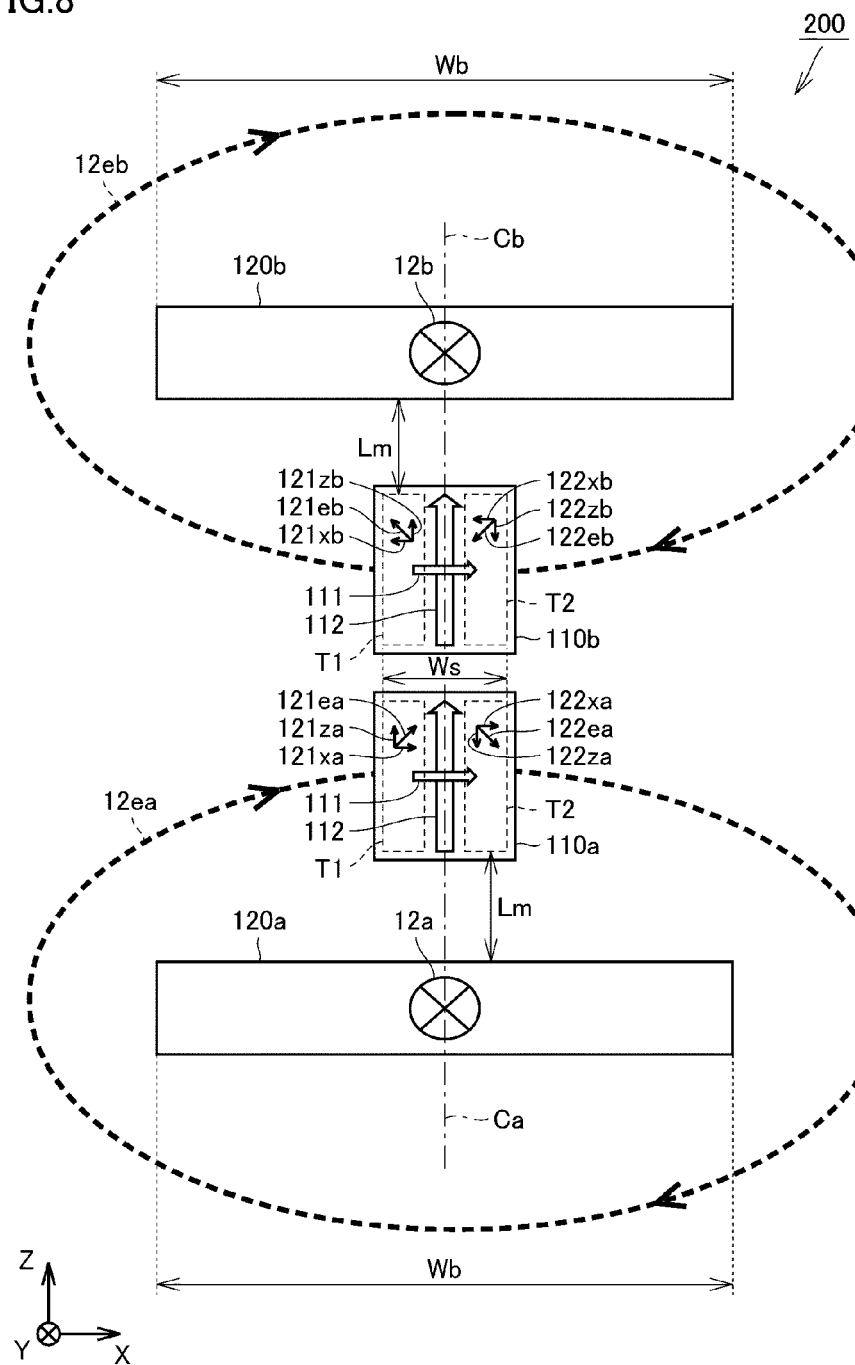
FIG. 8 is a cross-sectional view showing the structure of an electric current sensor according to a second preferred embodiment of the present invention.
Figure 9:
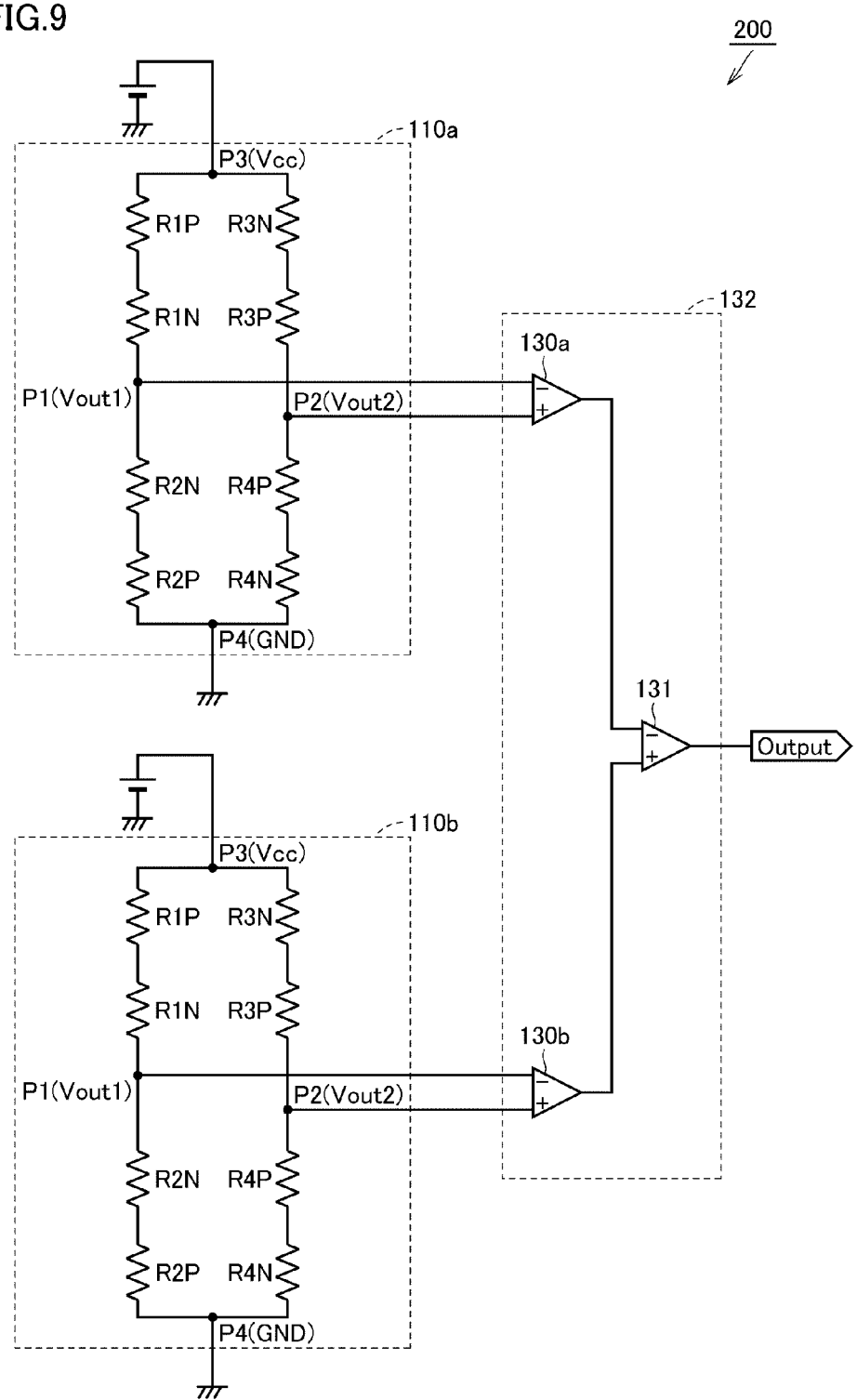
FIG. 9 is a circuit diagram showing the circuit configuration of the electric current sensor according to the second preferred embodiment of the present invention.

FIG. 8 is a cross-sectional view showing the structure of an electric current sensor according to a second preferred embodiment of the present invention. FIG. 9 is a circuit diagram showing the circuit configuration of the electric current sensor according to the second preferred embodiment of the present invention. In FIG. 8, an X-axis direction refers to the direction of the width of a primary conductor 120. A Y-axis direction refers to the direction of the length of the primary conductor 120. A Z-axis direction refers to the direction of the thickness of the primary conductor 120. FIG. 8 shows a virtual center line Ca that passes through the center of the width of a first flow path portion 120a of the primary conductor 120 and extends in the thickness direction (Z-axis direction) of the primary conductor 120, and a virtual center line Cb that passes through the center of the width of a second flow path portion 120b of the primary conductor 120 and extends in the thickness direction (Z-axis direction) of the primary conductor 120.

As shown in FIG. 8, the electric current sensor 200 according to the second preferred embodiment of the present invention includes a first magnetic sensor 110a and a second magnetic sensor 110b, as the magnetic sensor 110. An electric current to be measured is divided into two currents 12a and 12b to flow through two flow paths of the primary conductor 120 in the length direction (Y-axis direction) of the primary conductor 120.

In the primary conductor 120, the first flow path portion 120a defining one of the two flow paths, and the second flow path portion 120b defining the other of the two flow paths extend in an opposed manner a certain distance away from each other in the thickness direction (Z-axis direction) of the primary conductor 120.

In both of the first magnetic sensor 110a and the second magnetic sensor 110b, a first magnetic sensor area T1 and a second magnetic sensor area T2 are provided in a direction along a detection axis 111.

The first magnetic sensor 110a is opposed to the first flow path portion 120a in the thickness direction (Z-axis direction) of the primary conductor 120, between the first flow path portion 120a and the second flow path portion 120b, such that the direction of the first magnetic sensor 110a along the sensitivity variation axis 112 intersects the width direction (X-axis direction) of the primary conductor 120. In this preferred embodiment, the direction of the first magnetic sensor 110a along the sensitivity variation axis 112 intersects the width direction (X-axis direction) of the first flow path portion 120a at right angles. The first magnetic sensor 110a is disposed on the virtual center line Ca, and opposed to a front surface of the first flow path portion 120a. The virtual center line Ca is situated between the first magnetic sensor area T1 and the second magnetic sensor area T2.

The second magnetic sensor 110b is opposed to the second flow path portion 120b in the thickness direction (Z-axis direction) of the primary conductor 120, between the first flow path portion 120a and the second flow path portion 120b, such that the direction of the second magnetic sensor 110b along the sensitivity variation axis 112 intersects the width direction (X-axis direction) of the primary conductor 120. In this preferred embodiment, the direction of the second magnetic sensor 110b along the sensitivity variation axis 112 intersects the width direction (X-axis direction) of the second flow path portion 120b at right angles. The second magnetic sensor 110b is disposed on the virtual center line Cb, and opposed to a rear surface of the second flow path portion 120b. The virtual center line Cb is situated between the first magnetic sensor area T1 and the second magnetic sensor area T2.

When the electric current 12a to be measured flows through the first flow path portion 120a of the primary conductor 120, a measured magnetic field 12ea rotating counterclockwise in the drawing is generated by the so-called corkscrew rule. As a result, an input magnetic field 121ea is applied to the first magnetic sensor area T1 of the first magnetic sensor 110a, while an input magnetic field 122ea is applied to the second magnetic sensor area T2 of the first magnetic sensor 110a.

The input magnetic field 121ea includes a magnetic field component 121xa in the direction of an arrow of the detection axis 111, and a magnetic field component 121za in a first direction along the sensitivity variation axis 112. The input magnetic field 122ea includes a magnetic field component 122xa in the direction of the arrow of the detection axis 111 and a magnetic field component 122za in a second direction along the sensitivity variation axis 112.

Since the magnetic field component 121za travels in the same direction as the magnetization direction of the magnetoresistive film 114 (the direction of the arrow of the sensitivity variation axis 112), each of magnetoresistive elements R1P, R2P, R3P and R4P of the first magnetic sensor 110a has decreased output sensitivity. Since the magnetic field component 122za travels in the opposite direction to the magnetization direction of the magnetoresistive film 114 (the direction of the arrow of the sensitivity variation axis 112), each of magnetoresistive elements R1N, R2N, R3N and R4N of the first magnetic sensor 110a has increased output sensitivity.

Since both of the magnetic field component 121xa and the magnetic field component 122xa travel in the direction of the arrow of the detection axis 111, each of the magnetoresistive elements R1P, R1N, R4P and R4N of the first magnetic sensor 110a has an increased resistance value, while each of the magnetoresistive elements R2P, R2N, R3P and R3N of the first magnetic sensor 110a has a decreased resistance value.

When the electric current 12b to be measured flows through the second flow path portion 120b of the primary conductor 120, a measured magnetic field 12eb rotating counterclockwise in the drawing is generated by the so-called corkscrew rule. As a result, an input magnetic field 121eb is applied to the first magnetic sensor area T1 of the second magnetic sensor 110b, while an input magnetic field 122eb is applied to the second magnetic sensor area T2 of the second magnetic sensor 110b.

The input magnetic field 121eb includes a magnetic field component 121xb in the direction of an arrow of the detection axis 111, and a magnetic field component 121zb in a first direction along the sensitivity variation axis 112. The input magnetic field 122eb includes a magnetic field component 122xb in the direction of the arrow of the detection axis 111 and a magnetic field component 122zb in a second direction along the sensitivity variation axis 112.

Since the magnetic field component 121zb travels in the same direction as the magnetization direction of the magnetoresistive film 114 (the direction of the arrow of the sensitivity variation axis 112), each of magnetoresistive elements R1P, R2P, R3P and R4P of the second magnetic sensor 110b has decreased output sensitivity. Since the magnetic field component 122zb travels in the opposite direction to the magnetization direction of the magnetoresistive film 114 (the direction of the arrow of the sensitivity variation axis 112), each of magnetoresistive elements R1N, R2N, R3N and R4N of the second magnetic sensor 110b has increased output sensitivity.

Since both of the magnetic field component 121xb and the magnetic field component 122xb travel in the direction of the arrow of the detection axis 111, each of the magnetoresistive elements R1P, R1N, R4P and R4N of the second magnetic sensor 110b has an increased resistance value, while each of the magnetoresistive elements R2P, R2N, R3P and R3N of the second magnetic sensor 110b has a decreased resistance value.

As shown in FIG. 9, the electric current sensor 200 according to the second preferred embodiment of the present invention further includes a calculator 132 that calculates the values of the electric currents 12a and 12b to be measured by arithmetic processing of the detection value of the first magnetic sensor 110a and the detection value of the second magnetic sensor 110b.

The calculator 132 preferably includes a first differential amplifier 130a that differentially amplifies the output voltage Vout1 and the output voltage Vout2 of the first magnetic sensor 110a and outputs a detection value, a second differential amplifier 130b that differentially amplifies the output voltage Vout1 and the output voltage Vout2 of the second magnetic sensor 110b and outputs a detection value, and a third differential amplifier 131 that subtracts the detection value of the second magnetic sensor 110b from the detection value of the first magnetic sensor 110a. The calculator 132 may alternatively include a subtractor instead of the third differential amplifier 131.

As described above, the direction of magnetic flux acting on the first magnetic sensor 110a in the X-axis direction is opposite to the direction of magnetic flux acting on the second magnetic sensor 110b in the X-axis direction. Thus, when detecting the strengths of the measured magnetic fields 12ea and 12eb generated by the electric currents 12a and 12b to be measured flowing through the primary conductor 120, the detection value of the first magnetic sensor 110a is in opposite phase with the detection value of the second magnetic sensor 110b.

Thus, when the strength of the measured magnetic field 12*ea* detected by the first magnetic sensor 110*a* is a positive value, the strength of the measured magnetic field 12*eb* detected by the second magnetic sensor 110*b* is a negative value. The calculator 132 calculates the detection value of the first magnetic sensor 110*a* and the detection value of the second magnetic sensor 110*b*.

The calculator 132 subtracts the detection value of the second magnetic sensor 110*b* from the detection value of the first magnetic sensor 110*a*. As a result, the absolute value of the detection value of the first magnetic sensor 110*a* and the absolute value of the detection value of the second magnetic sensor 110*b* are added. As a result of addition, the values of the electric currents 12*a* and 12*b* to be measured that have flowed through the primary conductor 120 are calculated.

In the electric current sensor 200 according to this preferred embodiment, since the first magnetic sensor 110*a* and the second magnetic sensor 110*b* are disposed adjacent to one another, an outside magnetic field source cannot be physically situated between the first magnetic sensor 110*a* and the second magnetic sensor 110*b*.

Therefore, the direction of a magnetic field component of a magnetic field applied by the outside magnetic field source to the first magnetic sensor 110*a* in a direction along the detection axis 111 is the same as the direction of a magnetic field component of a magnetic field applied by the outside magnetic field source to the second magnetic sensor 110*b* in the direction along the detection axis 111. Thus, when the strength of the outside magnetic field detected by the first magnetic sensor 110*a* is a positive value, the strength of the outside magnetic field detected by the second magnetic sensor 110*b* is a positive value too.

As a result, by subtracting the detection value of the second magnetic sensor 110*b* from the detection value of the first magnetic sensor 110*a*, the calculator 132 subtracts the absolute value of the detection value of the second magnetic sensor 110*b* from the absolute value of the detection value of the first magnetic sensor 110*a*. Therefore, the magnetic field generated by the outside magnetic field source is only slightly detected. In other words, the effects of the outside magnetic field are reduced.

As a modification example of this preferred embodiment, the direction of the detection axis 111 in which a detection value becomes positive may be reversed (180° reversed) between the first magnetic sensor 110*a* and the second magnetic sensor 110*b*. In this case, when the strength of an outside magnetic field detected by the first magnetic sensor 110*a* is a positive value, the strength of an outside magnetic field detected by the second magnetic sensor 110*b* is a negative value.

On the other hand, when detecting the strengths of the measured magnetic fields 12*ea* and 12*eb* generated by the electric currents 12*a* and 12*b* to be measured flowing through the primary conductor 120, the detection value of the first magnetic sensor 110*a* is in phase with the detection value of the second magnetic sensor 110*b*.

In the modification example, an adder or a summing amplifier is preferably used instead of the third differential amplifier 131 of the calculator 132. The adder or the summing amplifier adds the detection value of the first magnetic sensor 110*a* and the detection value of the second magnetic sensor 110*b* to the strength of the outside magnetic field so that the absolute value of the detection value of the second magnetic sensor 110*b* is subtracted from the absolute value of the detection value of the first magnetic sensor 110*a*. Therefore, the magnetic field generated by the outside magnetic field source is only slightly detected. In other words, the effects of the outside magnetic field are reduced.

On the other hand, the adder or the summing amplifier adds the detection value of the first magnetic sensor 110*a* and the detection value of the second magnetic sensor 110*b* to the strengths of the measured magnetic fields 12*ea* and 12*eb* generated by the electric currents 12*a* and 12*b* to be measured flowing through the primary conductor 120 so that the absolute value of the detection value of the first magnetic sensor 110*a* is added to the absolute value of the detection value of the second magnetic sensor 110*b*. As a result of addition, the values of the electric currents 12*a* and 12*b* to be measured that have flowed through the primary conductor 120 are calculated.

As described above, the adder or the summing amplifier may alternatively be used in the calculation circuitry 132 instead of the third differential amplifier 131, while making the polarities of the input and output characteristics of the first magnetic sensor 110*a* and the second magnetic sensor 110*b* opposite to each other.

Third Preferred Embodiment

An electric current sensor according to a third preferred embodiment of the present invention will be described below. Note that, the main difference between an electric current sensor 300 according to this preferred embodiment and the electric current sensor 200 according to the second preferred embodiment is that a first flow path portion and a second flow path portion are staggered with respect to each other, and a first magnetic sensor area and a second magnetic sensor area are provided in a direction along a sensitivity variation axis. The same reference numerals indicate the same components as those of the electric current sensor 200 of the second preferred embodiment, and a description thereof is not repeated.

Figure 10:
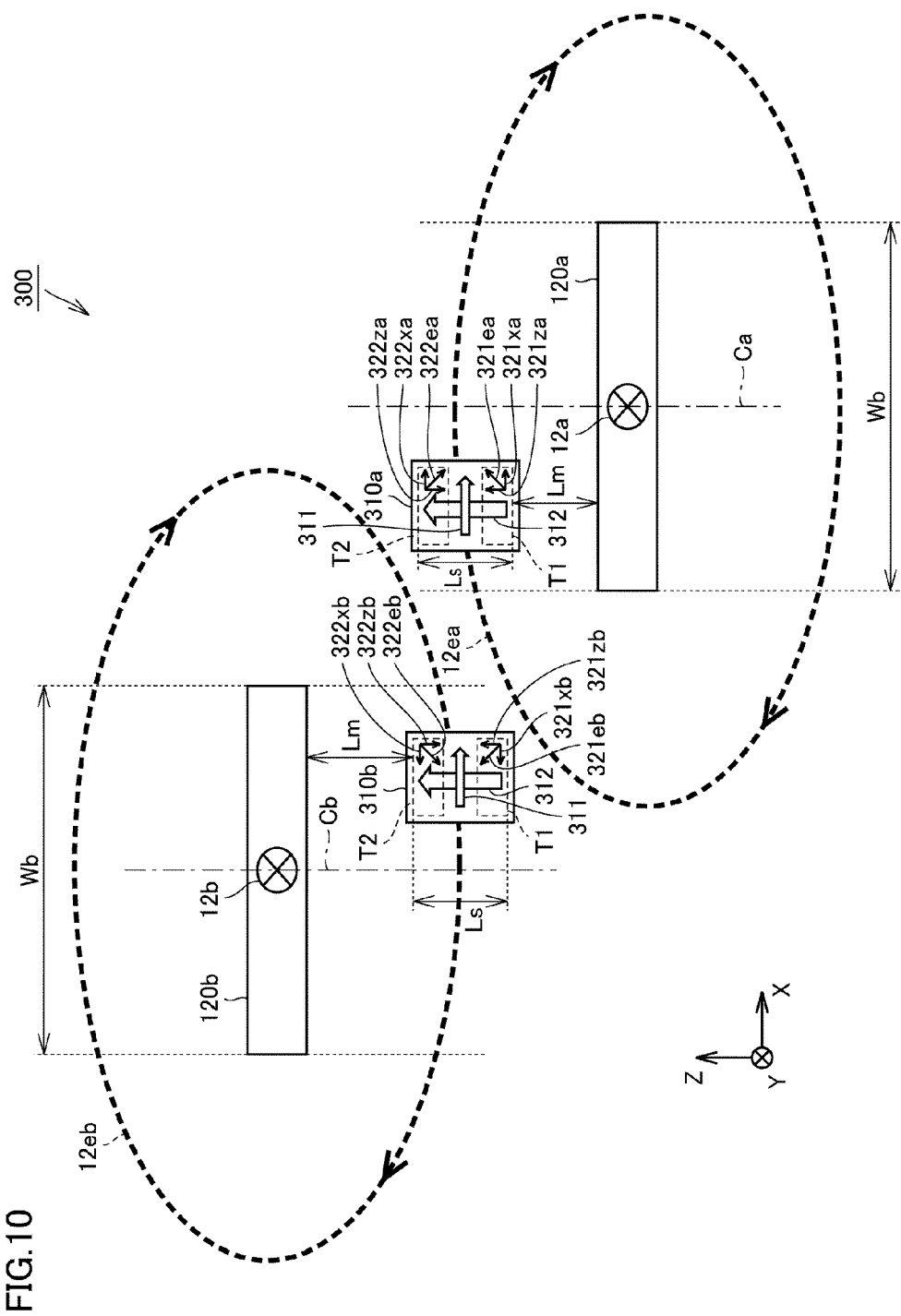
FIG. 10 is a cross-sectional view showing the structure of an electric current sensor according to a third preferred embodiment of the present invention.
Figure 11:
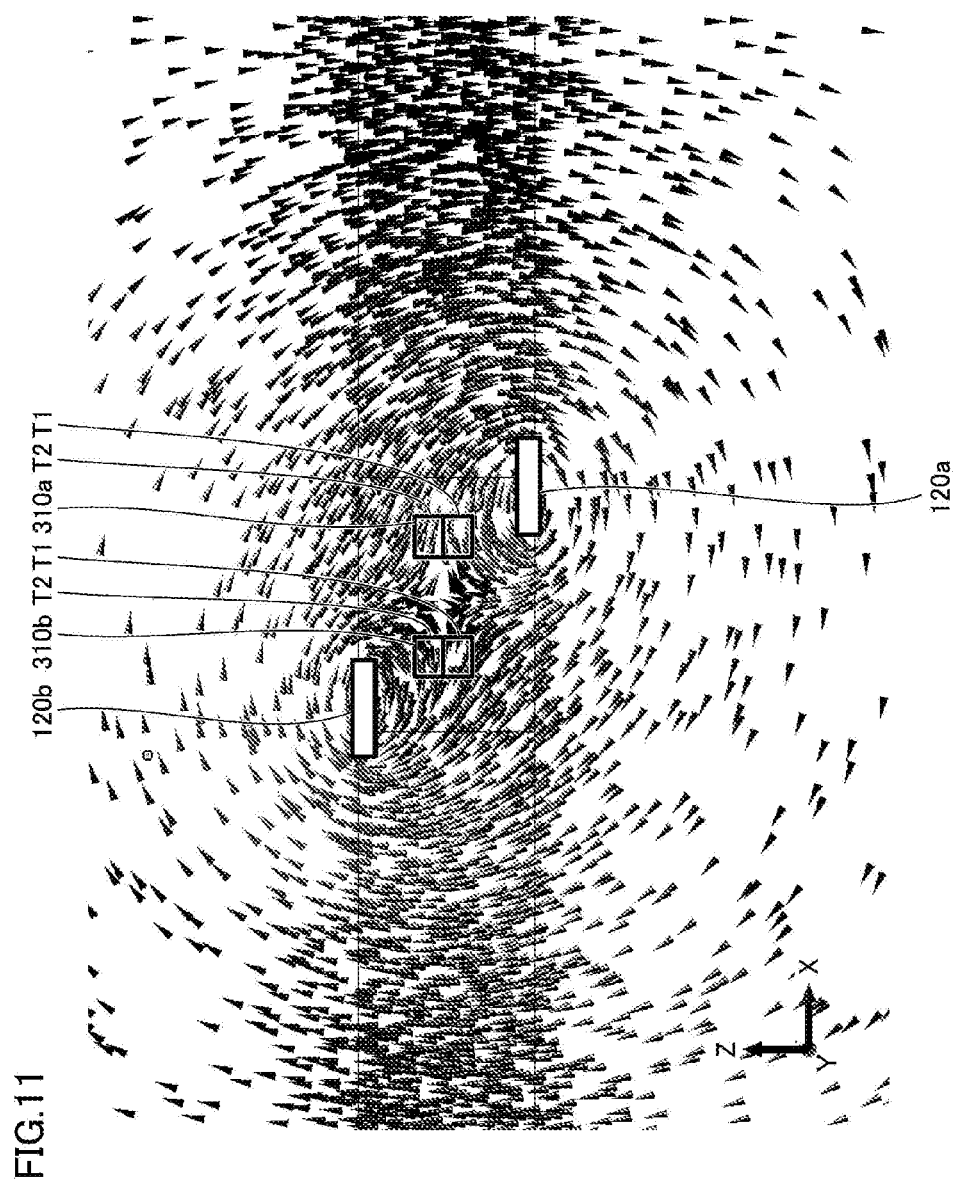
FIG. 11 is a drawing of lines of magnetic flux that shows a simulation result of magnetic flux density of a measured magnetic field generated around a primary conductor provided in the electric current sensor according to the third preferred embodiment of the present invention.
Figure 12:
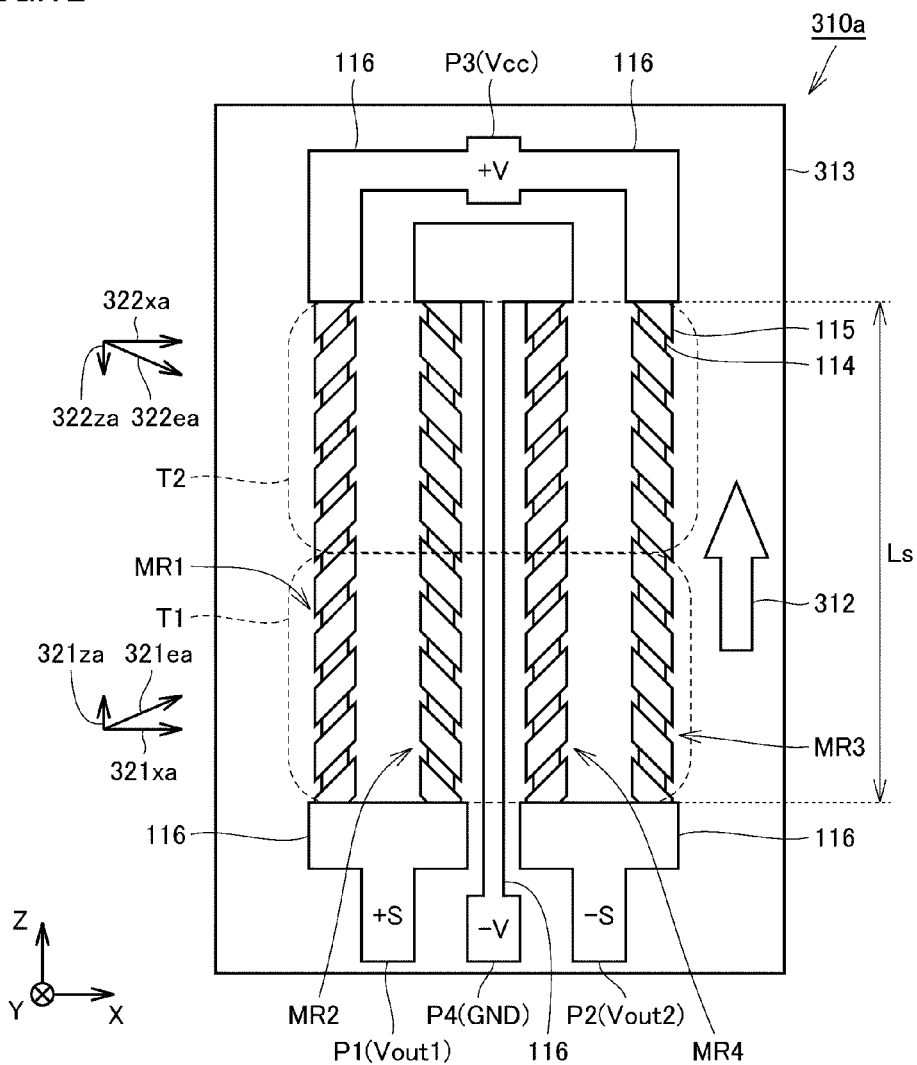
FIG. 12 is a plan view showing the structure of a first magnetic sensor provided in the electric current sensor according to the third preferred embodiment of the present invention.
Figure 13:
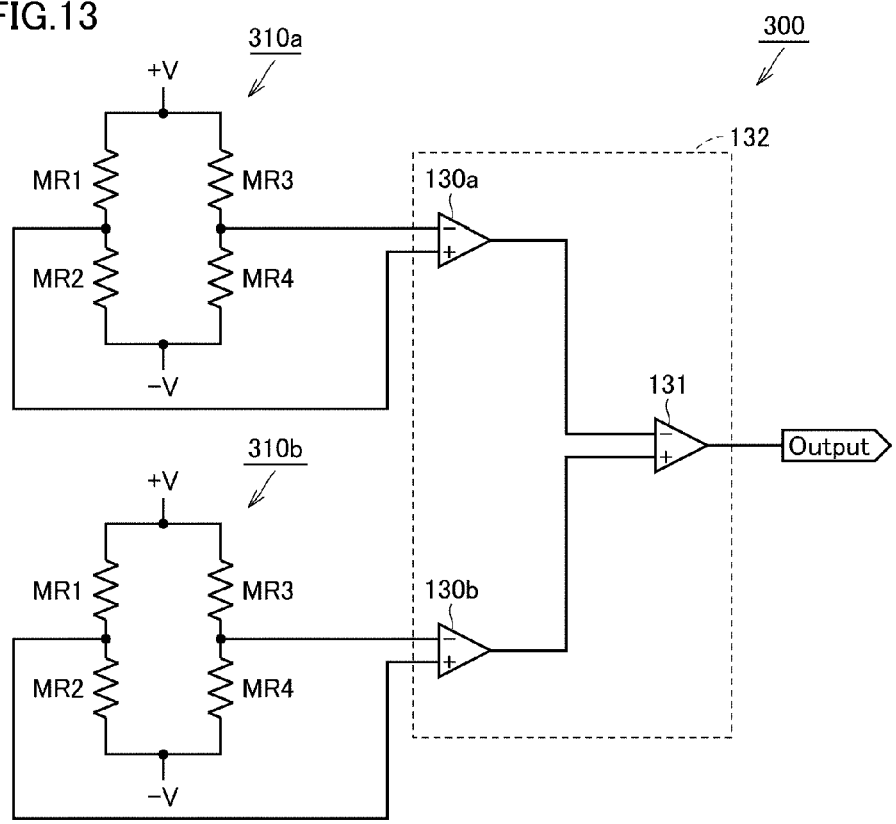
FIG. 13 is a circuit diagram showing the circuit configuration of the electric current sensor according to the third preferred embodiment of the present invention.

FIG. 10 is a cross-sectional view showing the structure of an electric current sensor according to a third preferred embodiment of the present invention. FIG. 11 is a drawing of lines of magnetic flux that shows a simulation result of magnetic flux density of a measured magnetic field generated around a primary conductor provided in the electric current sensor according to the third preferred embodiment of the present invention. FIG. 12 is a plan view showing the structure of a first magnetic sensor provided in the electric current sensor according to the third preferred embodiment of the present invention. FIG. 13 is a circuit diagram showing the circuit configuration of the electric current sensor according to the third preferred embodiment of the present invention. FIG. 11 shows the same cross-sectional view as FIG. 10.

As shown in FIG. 10, the electric current sensor 300 according to the third preferred embodiment of the present invention preferably includes a first magnetic sensor 310*a* and a second magnetic sensor 310*b*, as a magnetic sensor 310. An electric current to be measured is divided into two currents 12*a* and 12*b* to flow through two flow paths of a primary conductor 120 in the length direction (Y-axis direction) of the primary conductor 120.

In the primary conductor 120, a first flow path portion 120*a* defining one of the two flow paths, and a second flow path portion 120*b* defining the other of the two flow paths are staggered with respect to each other a certain distance away in the width direction (X-axis direction) of the primary conductor 120, and are staggered each other a certain distance away in the thickness direction (Z-axis direction) of the primary conductor 120. A front surface of the first flow path portion 120a and a rear surface of the second flow path portion 120b are arranged in parallel or substantially in parallel with each other.

Each of the first magnetic sensor 310a and the second magnetic sensor 310b has a detection axis 311 and a sensitivity variation axis 312 orthogonal to the detection axis 311, and detects the strength of a measured magnetic field 12ea or 12eb generated by an electric current 12a or 12b to be measured flowing through the first flow path portion 120a or the second flow path portion 120b of the primary conductor 120.

Each of the first magnetic sensor 310a and the second magnetic sensor 310b includes a first magnetic sensor area T1 the output sensitivity of which is decreased when the measured magnetic field 12ea or 12eb is applied to include a magnetic field component in a first direction along the sensitivity variation axis 312, and a second magnetic sensor area T2 the output sensitivity of which is increased when the measured magnetic field 12ea or 12eb is applied to include a magnetic field component in a second direction that is opposite to the first direction. The first magnetic sensor 310a and the second magnetic sensor 310b each detect the strength of the measured magnetic field 12ea or 12eb by combining an output from the first magnetic sensor area T1 and an output from the second magnetic sensor area T2. Note that, the first direction is the direction of an arrow of the sensitivity variation axis 312.

In each of the first magnetic sensor 310a and the second magnetic sensor 310b, the first magnetic sensor area T1 and the second magnetic sensor area T2 are arranged in a direction along the sensitivity variation axis 312.

The first magnetic sensor 310a is opposed to a portion of the first flow path portion 120a, which is on the side of the second flow path portion 120b in the width direction (X-axis direction) of the primary conductor 120, in the thickness direction (Z-axis direction) of the primary conductor 120, such that the direction of the first magnetic sensor 310a along the sensitivity variation axis 312 intersects the width direction (X-axis direction) of the primary conductor 120 between the first flow path portion 120a and the second flow path portion 120b in the thickness direction (Z-axis direction) of the primary conductor 120.

In this preferred embodiment, the direction of the first magnetic sensor 310a along the sensitivity variation axis 312 intersects the width direction (X-axis direction) of the first flow path portion 120a at right angles. The first magnetic sensor 310a preferably deviates from a virtual center line Ca in the width direction (X-axis direction) of the first flow path portion 120a, and opposed to the front surface of the first flow path portion 120a.

The second magnetic sensor 310b is opposed to a portion of the second flow path portion 120b, which is on the side of the first flow path portion 120a in the width direction (X-axis direction) of the primary conductor 120, in the thickness direction (Z-axis direction) of the primary conductor 120, such that the direction of the second magnetic sensor 310b along the sensitivity variation axis 312 intersects the width direction (X-axis direction) of the primary conductor 120 between the first flow path portion 120a and the second flow path portion 120b in the thickness direction (Z-axis direction) of the primary conductor 120.

In this preferred embodiment, the direction of the second magnetic sensor 310b along the sensitivity variation axis 312 intersects the width direction (X-axis direction) of the second flow path portion 120b at right angles. The second magnetic sensor 310b preferably deviates from a virtual center line Cb in the width direction (X-axis direction) of the second flow path portion 120b, and opposed to the rear surface of the second flow path portion 120b.

Next, the structure of the magnetic sensor provided in the electric current sensor 300 according to this preferred embodiment will be described.

As shown in FIG. 13, the first magnetic sensor 310a includes a Wheatstone bridge circuit (full-bridge circuit) in which four electrically connected magnetoresistive elements MR1, MR2, MR3 and MR4 are provided on a substrate 313.

The magnetoresistive elements MR1, MR2, MR3 and MR4 are arranged along a width direction (X-axis direction) of the substrate 313. A portion of each of the magnetoresistive elements MR1, MR2, MR3 and MR4 is situated in the first magnetic sensor area T1. Another portion of each of the magnetoresistive elements MR1, MR2, MR3 and MR4 is situated in the second magnetic sensor area T2. In this preferred embodiment, a half of each of the magnetoresistive elements MR1, MR2, MR3 and MR4 in a longitudinal direction (Z-axis direction) is situated in the first magnetic sensor area T1, while the remaining half thereof is situated in the second magnetic sensor area T2. The second magnetic sensor 310b preferably has the same structure as the first magnetic sensor 310a.

Ls represents the length of an area having the magnetoresistive elements MR1, MR2, MR3 and MR4 of the substrate 313 in the length direction (Z-axis direction). Ls≥0.05 Wb preferably holds true. As shown in FIG. 10, Lm represents the minimum distance between each of the magnetoresistive elements MR1, MR2, MR3 and MR4 and each of the front surface of the first flow path portion 120a and the rear surface of the second flow path portion 120b in the thickness direction (Z-axis direction) of the primary conductor 120. Lm≤Wb preferably holds true.

Each of the magnetoresistive elements MR1, MR2, MR3 and MR4 is an AMR (anisotropic magneto resistance) element. However, each of the magnetoresistive elements MR1, MR2, MR3 and MR4 may be a GMR (giant magneto resistance), a TMR (tunnel magneto resistance), a BMR (ballistic magneto resistance), a CMR (colossal magneto resistance) or the like.

On the substrate 313, an electrode pad P1 that takes out an output voltage Vout1, an electrode pad P2 that takes out an output voltage Vout2, an electrode pad P3 that applies a power voltage Vcc, and a grounded electrode pad P4 that applies a ground voltage are provided. A connection wiring 116 is provided on the substrate 113 formed by patterning together with the electrode pads.

One end of the magnetoresistive element MR1 is electrically connected to the electrode pad P3 through the connection wiring 116. The other end of the magnetoresistive element MR1 is electrically connected to the electrode pad P1 through the connection wiring 116. One end of the magnetoresistive element MR2 is electrically connected to the electrode pad P4 through the connection wiring 116. The other end of the magnetoresistive element MR2 is electrically connected to the electrode pad P1 through the connection wiring 116.

Electrically connecting the electrode pad P3, the magnetoresistive element MR1, the electrode pad P1, the magnetoresistive element MR2 and the electrode pad P4 in series, as described above, defines a first half bridge circuit.

One end of the magnetoresistive element MR3 is electrically connected to the electrode pad P3 through the connection wiring 116. The other end of the magnetoresistive element MR3 is electrically connected to the electrode pad P2 through the connection wiring 116. One end of the magnetoresistive element MR4 is electrically connected to the electrode pad P4 through the connection wiring 116. The other end of the magnetoresistive element MR4 is electrically connected to the electrode pad P2.

Electrically connecting the electrode pad P3, the magnetoresistive element MR3, the electrode pad P2, the magnetoresistive element MR4 and the electrode pad P4 in series, as described above, defines a second half bridge circuit.

Electrically connecting the first half bridge circuit and the second half bridge circuit in parallel with each other defines the Wheatstone bridge circuit (full-bridge circuit). The magnetic sensor includes the full-bridge circuit in this preferred embodiment, but may include only the first half bridge circuit or only one magnetoresistive element.

Each of the magnetoresistive elements MR1, MR2, MR3 and MR4 includes a magnetoresistive film 114 made of a ferromagnetic thin film located on the substrate 313, and a barber-pole electrode 115 provided on the magnetoresistive film 114. The magnetoresistive film 114 having a rectangular or substantially rectangular outer shape extends along the length direction (Z-axis direction) of the substrate 313. Each of the magnetoresistive elements MR1, MR2, MR3 and MR4 may include a magnetoresistive film 114 that is folded in a meandering manner. In this case, the magnetic sensor is able to be integrated and reduced in size.

A magnetization direction of the magnetoresistive film 114 is determined by the shape anisotropy of the magnetoresistive film 114. The sensitivity variation axis 312 extends along the magnetization direction of the magnetoresistive film 114, and extends along a longitudinal direction of the magnetoresistive film 114 in this preferred embodiment. The strength of magnetization of the magnetoresistive film 114 (the strength of a bias magnetic field) is preferably twice or more as high as the strength of a magnetic field component of the measured magnetic field along the sensitivity variation axis 312.

In each of the magnetoresistive elements MR1 and MR4, the barber-pole electrode 115 is defined by a plurality of first electrode portions that extend to obliquely intersect the longitudinal direction of the magnetoresistive film 114. The plurality of first electrode portions are arranged in the longitudinal direction of the magnetoresistive film 114 at established intervals from each other.

In each of the magnetoresistive elements MR2 and MR3, the barber-pole electrode 115 is defined by a plurality of second electrode portions that extend to obliquely intersect the longitudinal direction of the magnetoresistive film 114. The plurality of second electrode portions are arranged in the longitudinal direction of the magnetoresistive film 114 at established intervals from each other.

The barber-pole electrode 115 of the magnetoresistive element MR1 and the barber-pole electrode 115 of the magnetoresistive element MR3 are axisymmetric with respect to the virtual center line extending in the Z-axis direction between the first half bridge circuit and the second half bridge circuit. The barber-pole electrode 115 of the magnetoresistive element MR2 and the barber-pole electrode 115 of the magnetoresistive element MR4 are axisymmetric with respect to the virtual center line.

Each of the magnetoresistive elements MR1, MR2, MR3 and MR4 including the barber-pole electrode 115 has odd function input and output characteristics. More specifically, each of the magnetoresistive elements MR1, MR2, MR3 and MR4 having the barber-pole electrode 115 is biased such that an electric current flows in a direction that defines a certain angle (e.g. 45°) with the magnetization direction of the magnetoresistive film 114.

With this configuration, the resistance characteristics of each of the magnetoresistive elements MR1 and MR4 are opposite to those of each of the magnetoresistive elements MR2 and MR3. For example, when a magnetic field component is applied to the direction of an arrow of the detection axis 311, each of the magnetoresistive elements MR1 and MR4 has an increased resistance value, while each of the magnetoresistive elements MR2 and MR3 has a decreased resistance value.

By applying the power voltage Vcc between the electrode pad P3 and the electrode pad P4, an output voltage Vout1 is taken from the electrode pad P1, and an output voltage Vout2 is taken from the electrode pad P2 in accordance with the strength of the measured magnetic field. A differential amplifier differentially preferably amplifies the output voltage Vout1 and the output voltage Vout2. The power voltage Vcc may be a constant direct-current voltage, an alternating-current voltage, or a pulse voltage.

The operation of the electric current sensor 300 will be described below.

As shown in FIGS. 10 and 11, when the electric current I2a to be measured flows through the first flow path portion 120a of the primary conductor 120, the measured magnetic field 12ea rotating counterclockwise in the drawing is generated by the so-called corkscrew rule. When the electric current I2b to be measured flows through the second flow path portion 120b of the primary conductor 120, the measured magnetic field 12eb rotating counterclockwise in the drawing is generated by the so-called corkscrew rule.

As a result, an input magnetic field 321ea is applied to the first magnetic sensor area T1 of the first magnetic sensor 310a, while an input magnetic field 322ea is applied to the second magnetic sensor area T2 of the first magnetic sensor 310a. An input magnetic field 321eb is applied to the first magnetic sensor area T1 of the second magnetic sensor 310b, while an input magnetic field 322eb is applied to the second magnetic sensor area T2 of the second magnetic sensor 310b.

The input magnetic field 321ea includes a magnetic field component 321xa in the direction of the arrow of the detection axis 311 and a magnetic field component 321za in the first direction along the sensitivity variation axis 312. The input magnetic field 322ea includes a magnetic field component 322xa in the direction of the arrow of the detection axis 311 and a magnetic field component 322za in the second direction along the sensitivity variation axis 312.

Since the magnetic field component 321za travels in the same direction as the magnetization direction of the magnetoresistive film 114 (the direction of the arrow of the sensitivity variation axis 312), each of the magnetoresistive elements MR1, MR2, MR3 and MR4 of the first magnetic sensor 310a has decreased output sensitivity at a portion thereof (a portion situated in the first magnetic sensor area T1). Since the magnetic field component 322za travels in the opposite direction to the magnetization direction of the magnetoresistive film 114 (the direction of the arrow of the sensitivity variation axis 312), each of the magnetoresistive elements MR1, MR2, MR3 and MR4 of the first magnetic sensor 310a has increased output sensitivity at another portion thereof (a portion situated in the second magnetic sensor area T2).

Since both of the magnetic field component 321xa and the magnetic field component 322xa travel in the direction of the arrow of the detection axis 311, each of the magnetoresistive elements MR1 and MR4 of the first magnetic sensor 310a has an increased resistance value, while each of the magnetoresistive elements MR2 and MR3 of the first magnetic sensor 310a has a decreased resistance value.

The input magnetic field 321eb includes a magnetic field component 321xb in the direction of the arrow of the detection axis 311 and a magnetic field component 321zb in the first direction along the sensitivity variation axis 312. The input magnetic field 322eb includes a magnetic field component 322xb in the direction of the arrow of the detection axis 311 and a magnetic field component 322zb in the second direction along the sensitivity variation axis 312.

Since the magnetic field component 321zb travels in the same direction as the magnetization direction of the magnetoresistive film 114 (the direction of the arrow of the sensitivity variation axis 312), each of the magnetoresistive elements MR1, MR2, MR3 and MR4 of the second magnetic sensor 310b has decreased output sensitivity at a portion thereof (a portion situated in the first magnetic sensor area T1). Since the magnetic field component 322za travels in the opposite direction to the magnetization direction of the magnetoresistive film 114 (the direction of the arrow of the sensitivity variation axis 312), each of the magnetoresistive elements MR1, MR2, MR3 and MR4 of the second magnetic sensor 310b has increased output sensitivity at another portion thereof (a portion situated in the second magnetic sensor area T2).

Since both of the magnetic field component 321xb and the magnetic field component 322xb travel in the opposite direction to the arrow of the detection axis 311, each of the magnetoresistive elements MR1 and MR4 of the second magnetic sensor 310b has a decreased resistance value, while each of the magnetoresistive elements MR2 and MR3 of the second magnetic sensor 310b has an increased resistance value.

As shown in FIG. 13, the electric current sensor 300 according to the third preferred embodiment of the present invention preferably further includes a calculator 132 that calculates the values of the electric currents 12a and 12b to be measured by arithmetic processing of the detection value of the first magnetic sensor 310a and the detection value of the second magnetic sensor 310b.

The calculator 132 preferably includes a first differential amplifier 130a that differentially amplifies the output voltage Vout1 and the output voltage Vout2 of the first magnetic sensor 310a and outputs a detection value, a second differential amplifier 130b that differentially amplifies the output voltage Vout1 and the output voltage Vout2 of the second magnetic sensor 310b and outputs a detection value, and a third differential amplifier 131 that subtracts the detection value of the second magnetic sensor 310b from the detection value of the first magnetic sensor 310a. The calculator 332 may alternatively include a subtractor, instead of the third differential amplifier 131.

As described above, the direction of magnetic flux acting on the first magnetic sensor 310a in the X-axis direction is opposite to the direction of magnetic flux acting on the second magnetic sensor 310b in the X-axis direction. Thus, when detecting the strengths of the measured magnetic fields 12ea and 12eb generated by the electric currents 12a and 12b to be measured flowing through the primary conductor 120, the detection value of the first magnetic sensor 310a is in opposite phase with the detection value of the second magnetic sensor 310b.

Thus, when the strength of the measured magnetic field 12ea detected by the first magnetic sensor 310a is a positive value, the strength of the measured magnetic field 12eb detected by the second magnetic sensor 310b is a negative value. The calculator 132 calculates the detection value of the first magnetic sensor 310a and the detection value of the second magnetic sensor 310b.

The calculator 132 subtracts the detection value of the second magnetic sensor 310b from the detection value of the first magnetic sensor 310a. As a result, the absolute value of the detection value of the first magnetic sensor 310a and the absolute value of the detection value of the second magnetic sensor 310b are added. As a result of addition, the values of the electric currents 12a and 12b to be measured that have flowed through the primary conductor 120 are calculated.

In the electric current sensor 300 according to this preferred embodiment, since the first magnetic sensor 310a and the second magnetic sensor 310b are disposed adjacent to each other, an outside magnetic field source cannot be physically situated between the first magnetic sensor 310a and the second magnetic sensor 310b.

Therefore, the direction of a magnetic field component of a magnetic field applied by the outside magnetic field source to the first magnetic sensor 310a in a direction along the detection axis 311 is the same as the direction of a magnetic field component of a magnetic field applied by the outside magnetic field source to the second magnetic sensor 310b in the direction along the detection axis 311. Thus, when the strength of the outside magnetic field detected by the first magnetic sensor 310a is a positive value, the strength of the outside magnetic field detected by the second magnetic sensor 310b is a positive value too.

As a result, by subtracting the detection value of the second magnetic sensor 310b from the detection value of the first magnetic sensor 310a, the calculator 132 subtracts the absolute value of the detection value of the second magnetic sensor 310b from the absolute value of the detection value of the first magnetic sensor 310a. Therefore, the magnetic field generated by the outside magnetic field source is hardly detected. In other words, the effects of the outside magnetic field are reduced.

Since an output from the first magnetic sensor area T1 and an output from the second magnetic sensor area T2 are added up in an output of each of the first magnetic sensor 310a and the second magnetic sensor 310b provided in the electric current sensor 300 according to this preferred embodiment, fluctuation is reduced in output sensitivity. Each of the first magnetic sensor 310a and the second magnetic sensor 310b of the electric current sensor 300 maintains high linearity between the input magnetic field and the output voltage in a wide range. Therefore, the electric current sensor 300 according to this preferred embodiment has a wide measurement range while maintaining high sensitivity.

In each of the first magnetic sensor 310a and the second magnetic sensor 310b provided in the electric current sensor 300 according to this preferred embodiment, since the strength of magnetization of the magnetoresistive film 114 (the strength of the bias magnetic field) is twice or more as high as the strength of the magnetic field component of the measured magnetic field along the sensitivity variation axis 312, it is possible to have the effect of maintaining high linearity between the input magnetic field and the output voltage in a wide range.

In the electric current sensor 300 according to this preferred embodiment, since $Ls \geq 0.05$ Wb and $Lm \leq Wb$ hold true, it is possible to stably obtain the effect of having a wide measurement range, while maintaining high sensitivity.

An electric current sensor according to a modification example of the third preferred embodiment of the present invention will be described. Note that, the main difference between an electric current sensor according to the modification example of the third preferred embodiment of the present invention and the electric current sensor 300 according to the third preferred embodiment of the present invention is that a substrate is die-bonded to a support and no barber-pole electrode is provided in a magnetic sensor provided therein. The same reference numerals indicate the same components as those of the electric current sensor 300 of the third preferred embodiment of the present invention, and a description thereof is not repeated.

Figure 14:
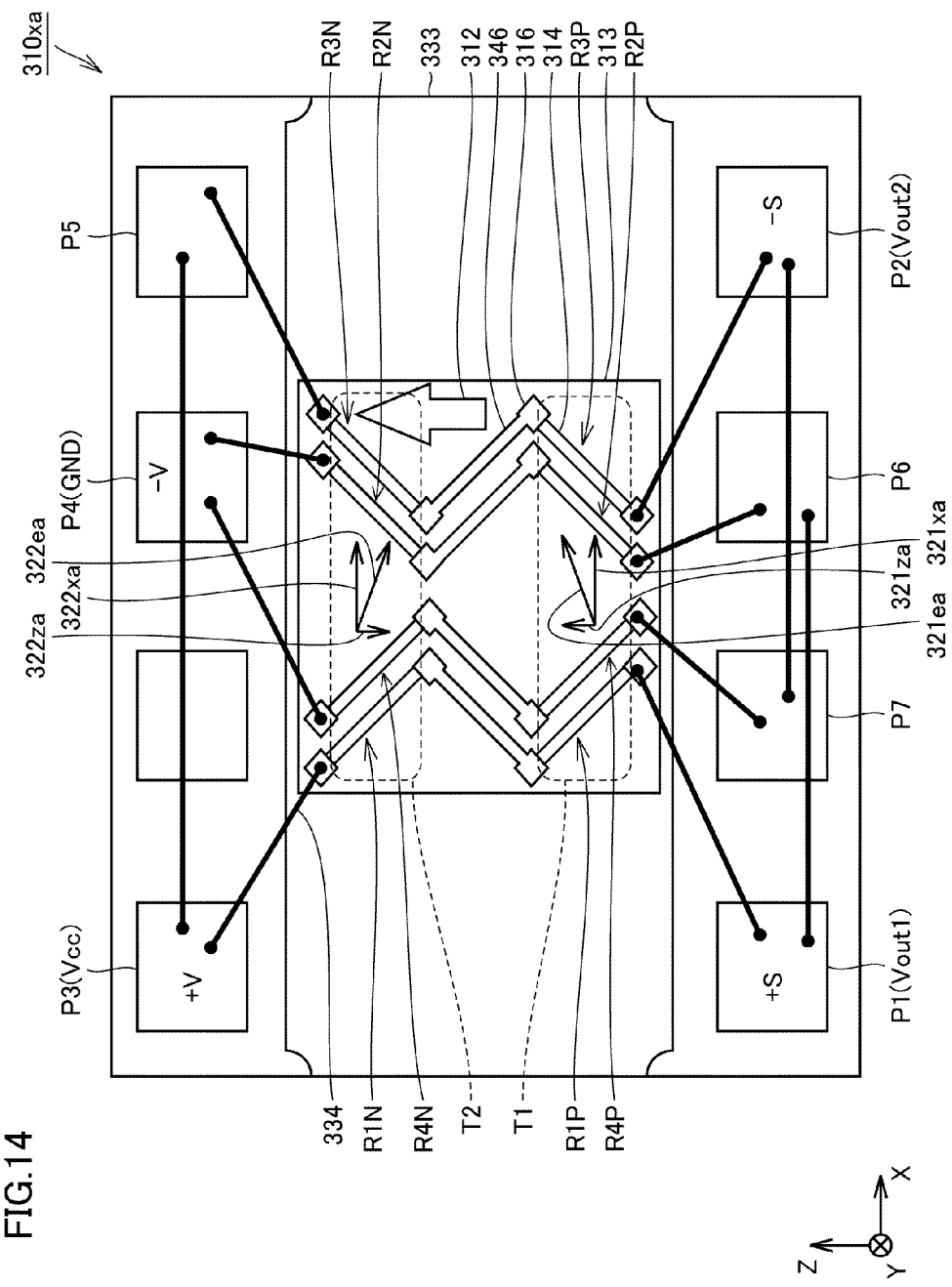
FIG. 14 is a plan view showing the structure of a first magnetic sensor provided in an electric current sensor according to a modification example of the third preferred embodiment of the present invention.
Figure 15:
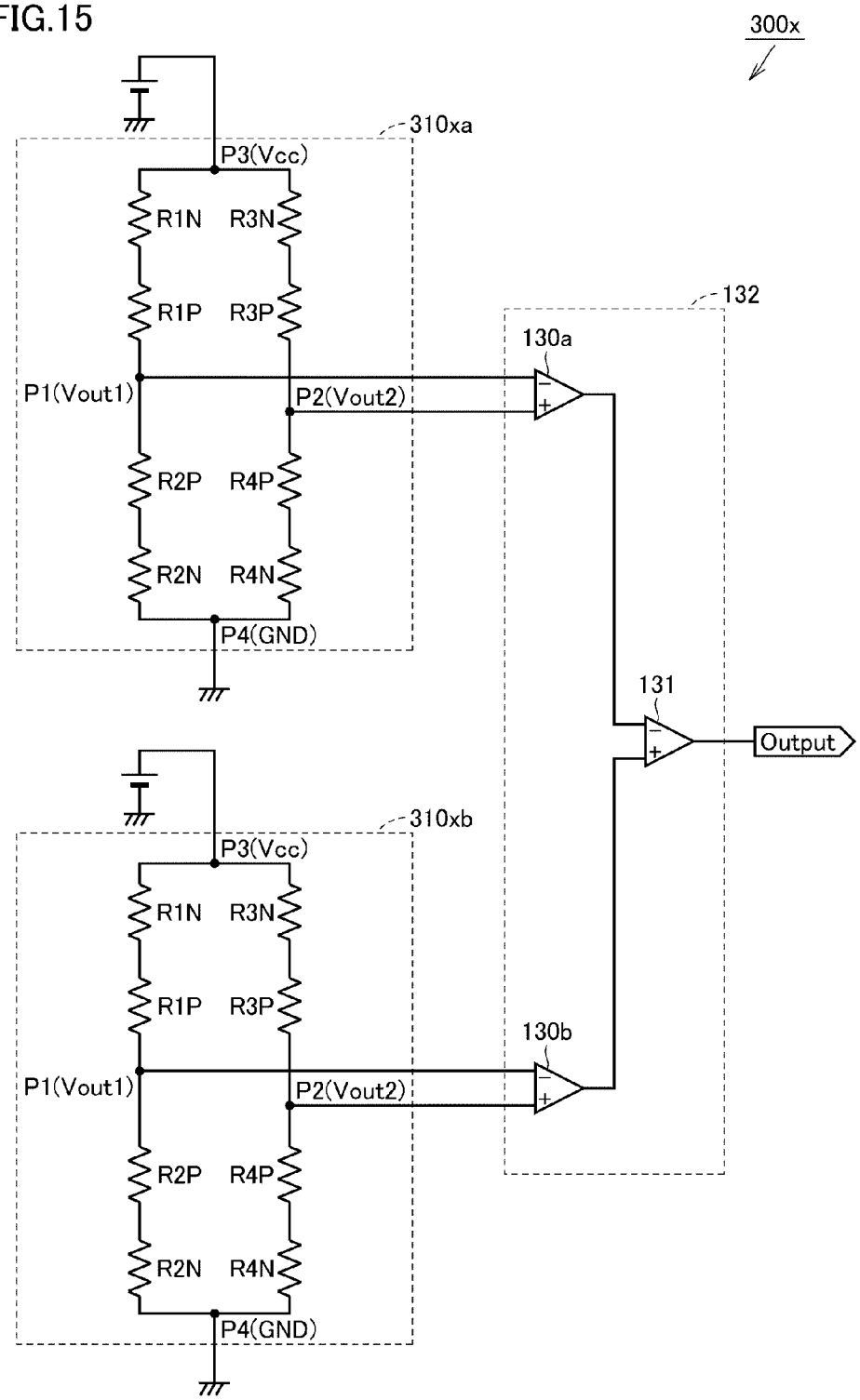
FIG. 15 is a circuit diagram showing the circuit configuration of the electric current sensor according to the modification example of the third preferred embodiment of the present invention.

FIG. 14 is a plan view showing the structure of a first magnetic sensor provided in an electric current sensor according to the modification example of the third preferred embodiment of the present invention. FIG. 15 is a circuit diagram showing the circuit configuration of the electric current sensor according to the modification example of the third preferred embodiment of the present invention. In FIG. 14, an X-axis direction represents the width direction of a substrate 313 included in a first magnetic sensor 310xa, a Y-axis direction represents the thickness direction thereof, and a Z-axis direction represents the length direction thereof. A second magnetic sensor 310xb has the same structure as the first magnetic sensor 310xa.

As shown in FIG. 14, in the first magnetic sensor 310xa is provided in an electric current sensor 300x according to the modification example of the third preferred embodiment of the present invention, the substrate 313 is die-bonded on a support 333.

On the support 333, an electrode pad P1 that takes out an output voltage Vout1, an electrode pad P2 that takes out an output voltage Vout2, an electrode pad P3 that applies a power voltage Vcc, a grounded electrode pad P4 that applies a ground voltage and electrode pads P5, P6 and P7 as relay electrodes are provided. The electrode pads P1, P2, P6 and P7 are arranged along the width direction (X-axis direction) of the substrate 313. The electrode pads P3, P4 and P5 are arranged along the width direction (X-axis direction) of the substrate 313. The substrate 313 is disposed between the line of the arranged electrode pads P1, P2, P6 and P7 and the line of the electrode pads P3, P4 and P5 in the length direction (Z-axis direction) of the substrate 313.

There is preferably no barber-pole electrode provided in the first magnetic sensor 310xa. Each of the eight magnetoresistive elements R1P, R1N, R2P, R2N, R3P, R3N, R4P and R4N provided on the substrate 113 is defined by only a magnetoresistive film 314 provided on the substrate 313. The magnetoresistive elements R1P, R2P, R3P and R4P are each situated in a first magnetic sensor area T1. The magnetoresistive elements R1N, R2N, R3N and R4N are each situated in a second magnetic sensor area T2.

The magnetoresistive films 314 defining the magnetoresistive elements R1P, R1N, R4P and R4N extend in parallel with each other to intersect the direction of application of a bias magnetic field. In this preferred embodiment, each of the magnetoresistive films 314 defining the magnetoresistive elements R1P, R1N, R4P and R4N intersects the direction of application of the bias magnetic field at approximately 45°, for example.

The magnetoresistive films 314 defining the magnetoresistive elements R2P, R2N, R3P and R3N extend in parallel or substantially in parallel with each other to intersect the direction of application of the bias magnetic field. In this preferred embodiment, each of the magnetoresistive films 314 defining the magnetoresistive elements R2P, R2N, R3P and R3N intersects the direction of application of the bias magnetic field at approximately 45°, for example.

The magnetoresistive film 314 of the magnetoresistive element R1P and the magnetoresistive film 314 of the magnetoresistive element R3P are preferably axisymmetric with respect to a virtual center line extending in the Z-axis direction between a first half bridge circuit and a second half bridge circuit. The magnetoresistive film 314 of the magnetoresistive element R2P and the magnetoresistive film 314 of the magnetoresistive element R4P are axisymmetric with respect to the virtual center line. The magnetoresistive film 314 of the magnetoresistive element R1N and the magnetoresistive film 314 of the magnetoresistive element R3N are axisymmetric with respect to the virtual center line. The magnetoresistive film 314 of the magnetoresistive element R2N and the magnetoresistive film 314 of the magnetoresistive element R4N are axisymmetric with respect to the virtual center line.

The magnetoresistive film 314 of the magnetoresistive element R1P and the magnetoresistive film 314 of the magnetoresistive element R4P are situated along with each other. The magnetoresistive film 314 of the magnetoresistive element R2P and the magnetoresistive film 314 of the magnetoresistive element R3P are situated along with each other. The magnetoresistive film 314 of the magnetoresistive element R1N and the magnetoresistive film 314 of the magnetoresistive element R4N are situated along with each other. The magnetoresistive film 314 of the magnetoresistive element R2N and the magnetoresistive film 314 of the magnetoresistive element R3N are situated along with each other.

Thus, the resistance characteristics of each of the magnetoresistive elements R1P, R1N, R4P and R4N are opposite to those of each of the magnetoresistive elements R2P, R2N, R3P and R3N.

Wire bonding pads 316 connected to both ends of each magnetoresistive film 314 and connection wiring 346 to connect the pads 316 to each other are defined on the substrate 313.

The pad 316 at one end of the magnetoresistive element R1N is connected to the electrode pad P3 with a wire 334. The pad 316 at the other end of the magnetoresistive element R1N is connected to the pad 316 at one end of the magnetoresistive element R1P with the connection wiring 346. The pad 316 at the other end of the magnetoresistive element R1P is connected to the electrode pad P1 with a wire 334. The electrode pad P1 is connected to the electrode pad P6 with a wire 334. The electrode pad P6 is connected to the pad 316 at the other end of the magnetoresistive element R2P with a wire 334. The pad 316 at one end of the magnetoresistive element R2P is connected to the pad 316 at the other end of the magnetoresistive element R2N with the connection wiring 346. The pad 316 at one end of the magnetoresistive element R2N is connected to the electrode pad P4 with a wire 334.

The pad 316 at one end of the magnetoresistive element R3N is connected to the electrode pad P5 with a wire 334. The electrode pad P5 is connected to the electrode pad P3 with a wire 334. The pad 316 at the other end of the magnetoresistive element R3N is connected to the pad 316 at one end of the magnetoresistive element R3P with the connection wiring 346. The pad 316 at the other end of the magnetoresistive element R3P is connected to the electrode pad P2 with a wire 334. The electrode pad P2 is connected to the electrode pad P7 with a wire 334. The electrode pad P7 is connected to the pad 316 at the other end of the magnetoresistive element R4P with a wire 334. The pad 316 at one end of the magnetoresistive element R4P is connected to the pad 316 at the other end of the magnetoresistive element R4N with the connection wiring 346. The pad 316 at one end of the magnetoresistive element R4N is connected to the electrode pad P4 with a wire 334.

The operation of the electric current sensor 300x will be described below.

As shown in FIGS. 10, 11, 14 and 15, an input magnetic field 321ea is applied to the first magnetic sensor area T1 of the first magnetic sensor 310xa, while an input magnetic field 322ea is applied to the second magnetic sensor area T2 of the first magnetic sensor 310xa. An input magnetic field 321eb is applied to the first magnetic sensor area T1 of the second magnetic sensor 310xb, while an input magnetic field 322eb is applied to the second magnetic sensor area T2 of the second magnetic sensor 310xb.

The input magnetic field 321ea includes a magnetic field component 321xa in the direction of an arrow of a detection axis 311 and a magnetic field component 321za in a first direction along a sensitivity variation axis 312. The input magnetic field 322ea includes a magnetic field component 322xa in the direction of the arrow of the detection axis 311 and a magnetic field component 322za in a second direction along the sensitivity variation axis 312.

Since the magnetic field component 321za travels in the same direction as the magnetization direction of the magnetoresistive film 314 (the direction of the arrow of the sensitivity variation axis 312), each of the magnetoresistive elements R1P, R2P, R3P and R4P of the first magnetic sensor 310xa has decreased output sensitivity. Since the magnetic field component 322za travels in the opposite direction to the magnetization direction of the magnetoresistive film 314 (the direction of the arrow of the sensitivity variation axis 312), each of the magnetoresistive elements R1N, R2N, R3N and R4N of the first magnetic sensor 310xa has increased output sensitivity.

Since both of the magnetic field component 321xa and the magnetic field component 322xa travel in the direction of the arrow of the detection axis 311, each of the magnetoresistive elements R1P, R1N, R4P and R4N of the first magnetic sensor 310xa has an increased resistance value, while each of the magnetoresistive elements R2P, R2N, R3P and R3N thereof has a decreased resistance value.

The input magnetic field 321eb includes a magnetic field component 321xb in the direction of an arrow of a detection axis 311 and a magnetic field component 321zb in a first direction along a sensitivity variation axis 312. The input magnetic field 322eb includes a magnetic field component 322xb in the direction of the arrow of the detection axis 311 and a magnetic field component 322zb in a second direction along the sensitivity variation axis 312.

Since the magnetic field component 321zb travels in the same direction as the magnetization direction of the magnetoresistive film 314 (the direction of the arrow of the sensitivity variation axis 312), each of the magnetoresistive elements R1P, R2P, R3P and R4P of the second magnetic sensor 310b has decreased output sensitivity. Since the magnetic field component 322za travels in the opposite direction to the magnetization direction of the magnetoresistive film 314 (the direction of the arrow of the sensitivity variation axis 312), each of the magnetoresistive elements R1N, R2N, R3N and R4N of the second magnetic sensor 310b has increased output sensitivity.

Since both of the magnetic field component 321xb and the magnetic field component 322xb travel in the direction opposite to the arrow of the detection axis 311, each of the magnetoresistive elements R1P, R1N, R4P and R4N of the second magnetic sensor 310b has a decreased resistance value, while each of the magnetoresistive elements R2P, R2N, R3P and R3N thereof has an increased resistance value.

Since an output from the first magnetic sensor area T1 and an output from the second magnetic sensor area T2 are added up in an output of each of the first magnetic sensor 310xa and the second magnetic sensor 310xb provided in the electric current sensor 300x according to the modification example of this preferred embodiment, fluctuation is reduced in output sensitivity. Each of the first magnetic sensor 310xa and the second magnetic sensor 310xb of the electric current sensor 300x maintains high linearity between the input magnetic field and the output voltage in a wide range. Therefore, the electric current sensor 300x according to the modification example of this preferred embodiment has a wide measurement range while maintaining high sensitivity.

Fourth Preferred Embodiment

An electric current sensor according to a fourth preferred embodiment of the present invention will be described below. Note that, the main difference between an electric current sensor 400 according to this preferred embodiment and the electric current sensor 100 according to the first preferred embodiment is that a magnetic sensor is opposed to a primary conductor in a width direction of the primary conductor. The same reference numerals indicate the same components as those of the electric current sensor 100 of the first preferred embodiment, and a description thereof is not repeated.

Figure 16:
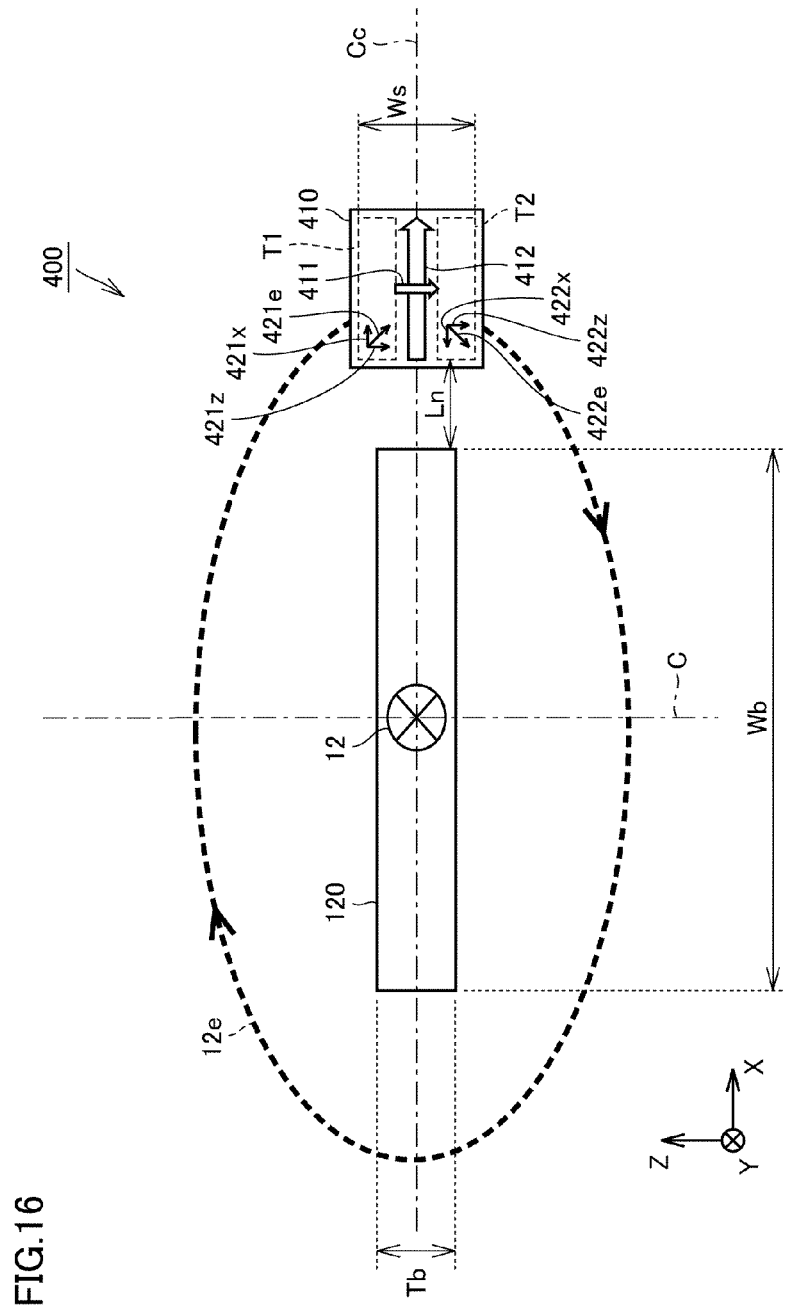
FIG. 16 is a cross-sectional view showing the structure of an electric current sensor according to a fourth preferred embodiment of the present invention.

FIG. 16 is a cross-sectional view showing the structure of an electric current sensor according to a fourth preferred embodiment of the present invention. In FIG. 16, an X-axis direction represents the width direction of a primary conductor 120, a Y-axis direction represents the length direction of the primary conductor 120, and a Z-axis direction represents the thickness direction of the primary conductor 120. FIG. 16 shows a virtual center line C that passes through the center of the width of the primary conductor 120 and extends in the thickness direction (Z-axis direction) of the primary conductor 120, and a virtual center line Cc that passes through the center of the thickness of the primary conductor 120 and extends in the width direction (X-axis direction) of the primary conductor 120.

As shown in FIG. 16, the electric current sensor 400 according to the fourth preferred embodiment of the present invention preferably includes the primary conductor 120 through which an electric current 12 to be measured flows, and one magnetic sensor 410 that detects the strength of a measured magnetic field 12e generated by the electric current 12 to be measured flowing through the primary conductor 120 and has a detection axis 411 and a sensitivity variation axis 412 orthogonal to the detection axis 411. The electric current 12 to be measured flows through the primary conductor 120 in the length direction (Y-axis direction) of the primary conductor 120. The primary conductor 120 preferably has a strip shape. Wb represents the width of the primary conductor 120. Tb represents the thickness of the primary conductor 120.

In the magnetic sensor 410, a first magnetic sensor area T1 and a second magnetic sensor area T2 are arranged in a direction along the detection axis 411. The magnetic sensor 410 is opposed to the primary conductor 120 in the width direction (X-axis direction) of the primary conductor 120, in such a manner that the direction of the magnetic sensor 410 along the sensitivity variation axis 412 intersects the thickness direction (Z-axis direction) of the primary conductor 120.

In this preferred embodiment, the direction of the magnetic sensor 410 along the sensitivity variation axis 412 intersects the thickness direction (Z-axis direction) of the primary conductor 120 at right angles. The magnetic sensor 410 is disposed on a virtual center line Cc, and opposed to a side surface of the primary conductor 120. The virtual center line Cc is situated between the first magnetic sensor area T1 and the second magnetic sensor area T2.

The magnetic sensor 410 preferably has the same structure as the magnetic sensor 110 shown in FIG. 2, although the magnetic sensor 410 is disposed in a different orientation from the magnetic sensor 110. To be more specific, the magnetic sensor 410 is disposed in an orientation in which the magnetic sensor 110 is turned 90° in a plane that is parallel to a main surface of the substrate 113.

Ws represents the length of an area having magnetoresistive elements R1P, R1N, R2P, R2N, R3P, R3N, R4P and R4N of the substrate 113 in the width direction. Ws≥0.05 Tb preferably holds true. As shown in FIG. 16, Ln represents the minimum distance between each of the magnetoresistive elements R1P, R1N, R2P, R2N, R3P, R3N, R4P and R4N and the side surface of the primary conductor 120 in the thickness direction (Z-axis direction) of the primary conductor 120. Ln≤Wb preferably holds true.

The operation of the electric current sensor 400 will be described below.

As shown in FIG. 16, when the electric current 12 to be measured flows through the primary conductor 120, a measured magnetic field 12e rotating counterclockwise in the drawing is generated by the so-called corkscrew rule. As a result, an input magnetic field 421e is applied to the first magnetic sensor area T1, while an input magnetic field 422e is applied to the second magnetic sensor area T2.

The input magnetic field 421e includes a magnetic field component 421z in the direction of an arrow of the detection axis 411 and a magnetic field component 421x in a first direction along the sensitivity variation axis 412. The input magnetic field 422e includes a magnetic field component 422z in the direction of the arrow of the detection axis 411 and a magnetic field component 422x in a second direction opposite to the first direction along the sensitivity variation axis 412. Note that, the first direction is the direction of an arrow of the sensitivity variation axis 412.

Since the magnetic field component 421x travels in the same direction as the magnetization direction of a magnetoresistive film (the direction of the arrow of the sensitivity variation axis 412), each of the magnetoresistive elements R1P, R2P, R3P and R4P situated in the first magnetic sensor area T1 has decreased output sensitivity. Since the magnetic field component 422x travels in the opposite direction to the magnetization direction of the magnetoresistive film (the direction of the arrow of the sensitivity variation axis 412), each of the magnetoresistive elements R1N, R2N, R3N and R4N situated in the second magnetic sensor area T2 has increased output sensitivity.

Since both of the magnetic field component 421z and the magnetic field component 422z travel in the direction of the arrow of the detection axis 411, each of the magnetoresistive elements R1P, R1N, R4P and R4N has an increased resistance value, while each of the magnetoresistive elements R2P, R2N, R3P and R3N has a decreased resistance value.

Since an output from the first magnetic sensor area T1 and an output from the second magnetic sensor area T2 are added up in an output from the magnetic sensor 410 provided in the electric current sensor 400 according to this preferred embodiment, fluctuation is reduced in output sensitivity. The magnetic sensor 410 of the electric current sensor 400 maintains high linearity between the input magnetic field and the output voltage in a wide range. Therefore, the electric current sensor 400 according to this preferred embodiment has a wide measurement range while maintaining high sensitivity.

In the electric current sensor 400 according to this preferred embodiment, since Ws≥0.05 Tb and Ln≤Wb hold true, it is possible to stably obtain the effect of having a wide measurement range, while maintaining high sensitivity.

A method for verifying that the magnetic sensor includes the first magnetic sensor area T1 and the second magnetic sensor area T2 will be described below. The following description takes the electric current sensor 100 according to the first preferred embodiment as an example. First, the resistance value of each of the eight magnetoresistive elements R1P, R1N, R2P, R2N, R3P, R3N, R4P and R4N is measured using ammeters and voltmeters.

Figure 17:
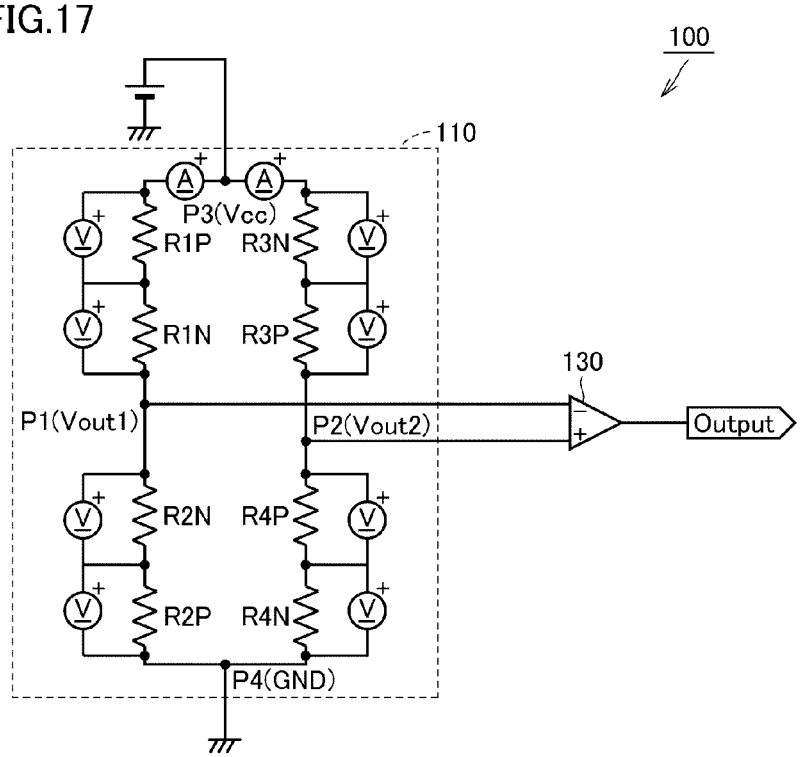
FIG. 17 is a circuit diagram showing a state of connecting ammeters and voltmeters to the electric current sensor according to the first preferred embodiment of the present invention.

FIG. 17 is a circuit diagram showing an example of how to connect the ammeters and the voltmeters to the electric current sensor according to the first preferred embodiment of the present invention. As shown in FIG. 17, the ammeter is preferably connected to each of the first half bridge circuit and the second half bridge circuit in series. The voltmeter is preferably connected to each of the eight magnetoresistive elements R1P, R1N, R2P, R2N, R3P, R3N, R4P and R4N in parallel. From measurement values of the ammeters and the voltmeters, the resistance value of each of the eight magnetoresistive elements R1P, R1N, R2P, R2N, R3P, R3N, R4P and R4N can be calculated. In this state, an electric current value flowing through the full bridge circuit is varied to measure a variation in the resistance value of each of the eight magnetoresistive elements R1P, R1N, R2P, R2N, R3P, R3N, R4P and R4N.

Figure 18:
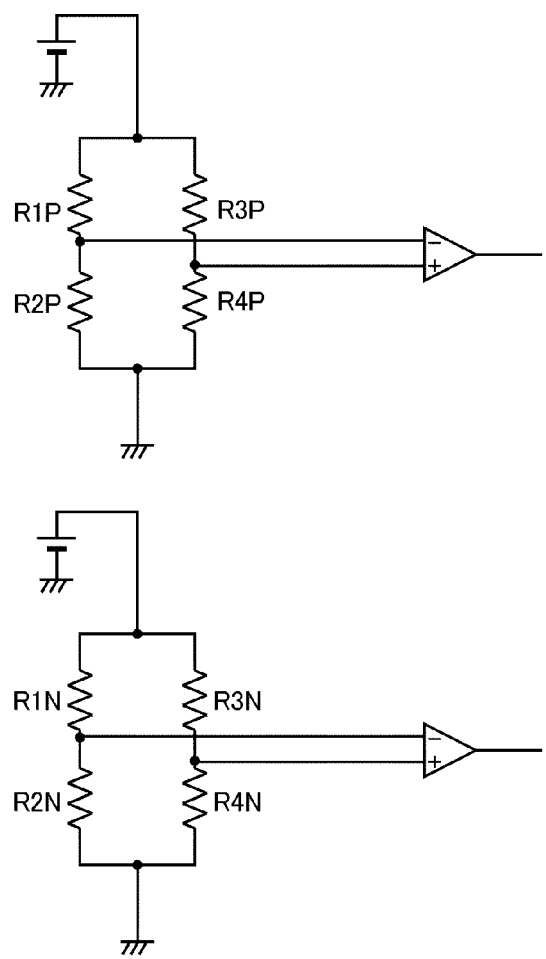
FIG. 18 is a circuit diagram showing the circuit configuration of a virtual first bridge circuit and a virtual second bridge circuit.

Next, a variation in an output voltage of a virtual first bridge circuit defined by the four magnetoresistive elements R1P, R2P, R3P and R4P to which a magnetic field containing a magnetic field component in a first direction is applied is calculated. In the same manner, a variation in an output voltage of a virtual second bridge circuit defined by the four magnetoresistive elements R1N, R2N, R3N and R4N to which a magnetic field containing a magnetic field component in a second direction that is opposite to the first direction is applied is calculated. FIG. 18 is a circuit diagram showing the circuit configuration of the virtual first bridge circuit and the virtual second bridge circuit.

When the output voltage of the virtual first bridge circuit shown in FIG. 18 varies, as shown in the alternate long and short dashed line of FIG. 6, each of the four magnetoresistive elements R1P, R2P, R3P and R4P defining the virtual first bridge circuit can be determined to be situated in the first magnetic sensor area T1. When the output voltage of the virtual second bridge circuit shown in FIG. 18 varies as shown in the dotted line of FIG. 6, each of the four magnetoresistive elements R1N, R2N, R3N and R4N defining the virtual second bridge circuit can be determined to be situated in the second magnetic sensor area T2. As a result, it is recognized that the magnetic sensor includes the first magnetic sensor area T1 and the second magnetic sensor area T2. The above-described method can be used for verifying that the magnetic sensor includes the first magnetic sensor area T1 and the second magnetic sensor area T2.

In the description of the above preferred embodiments, combinable configurations, features and elements may be mutually combined together.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electric current sensor comprising:
   a primary conductor through which an electric current to be measured flows; and
   at least one magnetic sensor that detects a strength of a magnetic field generated by the electric current flowing through the primary conductor, the magnetic sensor including a detection axis and a sensitivity variation axis orthogonal to the detection axis; wherein
   the magnetic sensor includes a first magnetic sensor area, first output sensitivity of the first magnetic sensor area is decreased when the magnetic field is applied to include a first magnetic field component in a first direction along the sensitivity variation axis, and a second magnetic sensor area, first output sensitivity of the second magnetic sensor area is increased when the magnetic field is applied to include a second magnetic field component in a second direction that is opposite to the first direction.

2. The electric current sensor according to claim 1, wherein the magnetic sensor detects the strength of the magnetic field by combining a detected output from the first magnetic sensor area and a detected output from the second magnetic sensor area.

3. The electric current sensor according to claim 1, wherein
   the magnetic sensor includes at least one magnetoresistive element;
   a portion of the at least one magnetoresistive element is situated in the first magnetic sensor area; and
   another portion of the at least one magnetoresistive element is situated in the second magnetic sensor area.

4. The electric current sensor according to claim 1, wherein
   the magnetic sensor includes a plurality of magnetoresistive elements;
   a portion of the plurality of magnetoresistive elements are situated in the first magnetic sensor area; and
   another portion of the plurality of magnetoresistive elements are situated in the second magnetic sensor area.

5. The electric current sensor according to claim 1, wherein
   in the magnetic sensor, the first magnetic sensor area and the second magnetic sensor area are provided in a direction along the detection axis; and
   the magnetic sensor is opposed to the primary conductor in the thickness direction of the primary conductor such that a direction of the magnetic sensor along the sensitivity variation axis intersects the width direction of the primary conductor.

6. The electric current sensor according to claim 1, wherein
   in the magnetic sensor, the first magnetic sensor area and the second magnetic sensor area are arranged in a direction along the detection axis; and
   the magnetic sensor is opposed to the primary conductor in the width direction of the primary conductor such that a direction of the magnetic sensor along the sensitivity variation axis intersects the thickness direction of the primary conductor.

7. The electric current sensor according to claim 1, wherein
   the electric current sensor includes a first magnetic sensor and a second magnetic sensor defining the magnetic sensor;
   the electric current is divided into two currents to flow through two flow paths of the primary conductor in the length direction of the primary conductor;
   in the primary conductor, a first flow path portion defining one of the two flow paths and a second flow path portion defining the other of the two flow paths are arranged in an opposed manner a certain distance away from each other in the thickness direction of the primary conductor;
   in each of the first magnetic sensor and the second magnetic sensor, the first magnetic sensor area and the second magnetic sensor area are arranged in the direction along the detection axis;
   the first magnetic sensor is opposed to the first flow path portion in the thickness direction of the primary conductor between the first flow path portion and the second flow path portion such that a direction of the first magnetic sensor along the sensitivity variation axis intersects the width direction of the primary conductor; and
   the second magnetic sensor is opposed to the second flow path portion in the thickness direction of the primary conductor between the first flow path portion and the second flow path portion such that a direction of the second magnetic sensor along the sensitivity variation axis intersects the width direction of the primary conductor.

8. The electric current sensor according to claim 1, wherein
   the electric current sensor includes a first magnetic sensor and a second magnetic sensor defining the magnetic sensor;
   the electric current is divided into two currents to flow through two flow paths of the primary conductor in the length direction of the primary conductor;
   in the primary conductor, a first flow path portion defining one of the two flow paths and a second flow path portion defining the other of the two flow paths are staggered relative to each other by a certain distance in the width direction of the primary conductor, and are staggered relative to each other by a certain distance in the thickness direction of the primary conductor;
   in each of the first magnetic sensor and the second magnetic sensor, the first magnetic sensor area and the second magnetic sensor area are arranged in a direction along the sensitivity variation axis;
   the first magnetic sensor is opposed, in the thickness direction of the primary conductor, to a portion of the first flow path portion that is on a side of the second flow path portion in the width direction of the primary conductor, between the first flow path portion and the second flow path portion in the thickness direction of the primary conductor, such that a direction of the first magnetic sensor along the sensitivity variation axis intersects the width direction of the primary conductor; and
   the second magnetic sensor is opposed, in the thickness direction of the primary conductor, to a portion of the second flow path portion that is on a side of the first flow path portion in the width direction of the primary conductor, between the first flow path portion and the second flow path portion in the thickness direction of the primary conductor, such that a direction of the second magnetic sensor along the sensitivity variation axis intersects the width direction of the primary conductor.

9. The electric current sensor according to claim 7, further comprising:
a calculator that calculates a value of the electric current by arithmetic processing of a detection value of the first magnetic sensor and a detection value of the second magnetic sensor; wherein
as to the strength of the magnetic field generated by the electric current flowing through the primary conductor, the detection value of the first magnetic sensor is in an opposite phase with the detection value of the second magnetic sensor; and
the calculator is a subtractor or a differential amplifier.

10. The electric current sensor according to claim 7, further comprising:
a calculator that calculates a value of the electric current by arithmetic processing of a detection value of the first magnetic sensor and a detection value of the second magnetic sensor; wherein
as to the strength of the magnetic field generated by the electric current flowing through the primary conductor, the detection value of the first magnetic sensor is in phase with the detection value of the second magnetic sensor; and
the calculator is an adder or a summing amplifier.

11. The electric current sensor according to claim 4, wherein each of the plurality of magnetoresistive elements includes a magnetoresistive film and an electrode provided on the magnetoresistive film.

12. The electric current sensor according to claim 4, wherein the plurality of magnetoresistive elements are electrically connected in a full-bridge circuit or a half-bridge circuit.

13. The electric current sensor according to claim 12, wherein an output of the full-bridge circuit or the half-bridge circuit is provided to a differential amplifier.

14. The electric current sensor according to claim 9, wherein the first magnetic sensor and the second magnetic sensor each include a plurality of magnetoresistive elements provided with a magnetoresistive film and an electrode provided on the magnetoresistive film.

15. The electric current sensor according to claim 14, wherein
the plurality of magnetoresistive elements of the first magnetic sensor are electrically connected in a first full-bridge circuit or a first half-bridge circuit; and
the plurality of magnetoresistive elements of the second magnetic sensor are electrically connected in a second full-bridge circuit or a second half-bridge circuit.

16. The electric current sensor according to claim 15, wherein
an output of the first full-bridge circuit or the first half-bridge circuit is provided to a first differential amplifier; and
an output of the second full-bridge circuit or the second half-bridge circuit is provided to a second differential amplifier.

17. The electric current sensor according to claim 16, wherein an output of the first differential amplifier and an output of the second differential amplifier are both provided to a third differential amplifier.

18. The electric current sensor according to claim 7, wherein
the first magnetic sensor and the second magnetic sensor each include a plurality of magnetoresistive elements provided with a magnetoresistive film and an electrode provided on the magnetoresistive film; and
a portion of each of the magnetoresistive elements is situated in the first magnetic sensor area and another portion of each of the magnetoresistive elements is situated in the second magnetic sensor area.

19. The electric current sensor according to claim 8, wherein
the first magnetic sensor and the second magnetic sensor each include a plurality of magnetoresistive elements provided with a magnetoresistive film and an electrode provided on the magnetoresistive film; and
a portion of each of the magnetoresistive elements is situated in the first magnetic sensor area and another portion of each of the magnetoresistive elements is situated in the second magnetic sensor area.

20. The electric current sensor according to claim 1, wherein at least one plating layer that is made of nickel, tin, silver, copper, or an alloy containing nickel, tin, silver, or copper is provided on a surface of the primary conductor.

* * * * *